(12) United States Patent
Lamkin et al.

(10) Patent No.: US 10,796,266 B2
(45) Date of Patent: Oct. 6, 2020

(54) AUTOMATED CONTEXT DRIVEN BUILD PLAN LIFECYCLE

(71) Applicant: The Boeing Company, Chicago, IL (US)

(72) Inventors: Brian R. Lamkin, Granite Falls, WA (US); Timothy A. Denney, Seattle, WA (US); Anthony J. Williams, Seattle, WA (US)

(73) Assignee: The Boeing Company, Chicago, IL (US)

( * ) Notice: Subject to any disclaimer, the term of this patent is extended or adjusted under 35 U.S.C. 154(b) by 56 days.

(21) Appl. No.: 15/974,611

(22) Filed: May 8, 2018

(65) Prior Publication Data

US 2019/0347584 A1    Nov. 14, 2019

(51) Int. Cl.
*G06Q 10/06* (2012.01)
*G06F 16/23* (2019.01)
*G06F 30/15* (2020.01)

(52) U.S. Cl.
CPC ........... *G06Q 10/067* (2013.01); *G06F 16/23* (2019.01); *G06F 30/15* (2020.01)

(58) Field of Classification Search
CPC .. G06F 17/50; G06F 2217/04; G06F 17/5086; G06F 17/5095; G06F 2217/06; G06F 2217/08; G06F 21/10; G06F 2217/02; G06F 17/00; G06F 2217/12; Y02P 90/265; Y02P 90/04; Y02P 90/18; Y02P 90/22; G06T 2219/024; G06T 19/00; Y10S 715/964; G05B 19/4097; G05B 2219/31056; G05B 2219/35008; G05B 2219/36284; G05B 2219/32038; G05B 2219/32126; G05B 2219/35034; G05B 2219/35153; G05B 2219/49301
See application file for complete search history.

(56) References Cited

U.S. PATENT DOCUMENTS

| | | | | |
|---|---|---|---|---|
| 5,191,534 A | * | 3/1993 | Orr | G06Q 10/06 700/105 |
| 6,801,820 B1 | * | 10/2004 | Lilly | G06Q 10/06 700/100 |
| 6,999,907 B2 | * | 2/2006 | Smith | G06F 17/5004 703/1 |
| 7,010,544 B2 | * | 3/2006 | Wallen | G05B 19/4097 707/791 |

(Continued)

*Primary Examiner* — Darrin D Dunn
(74) *Attorney, Agent, or Firm* — Yee & Associtaes, P.C.

(57) ABSTRACT

A control system for updating a context-driven build plan for production of a physical vehicle. The control system includes a design engineering database, a manufacturing database, and a production database all having pluralities of digital data objects. A criterion module is configured to assign a context criterion to any of the digital data objects. The criterion module assigns the context criterion to a particular digital data object based on properties and/or rules associated with a particular digital data object. A user interface receives an input of a requested change. A mapping module configured to establish a mapping between the particular design digital data object and any other digital data objects. An authority approves the requested change. A change module updates the context-driven build plan with a digital change request. Accordingly, an updated build plan is generated.

20 Claims, 18 Drawing Sheets

(56) References Cited

U.S. PATENT DOCUMENTS

| | | | |
|---|---|---|---|
| 7,069,192 B1* | 6/2006 | Freitag | G06F 17/50 700/182 |
| 7,136,785 B2* | 11/2006 | Mast | G06F 17/246 703/1 |
| 7,499,871 B1* | 3/2009 | McBrayer | G06Q 10/063 705/7.13 |
| 7,672,745 B1* | 3/2010 | Tuszynski | G05B 19/41875 700/29 |
| 8,768,656 B2* | 7/2014 | Yucel | G06F 17/5086 700/103 |
| 8,818,543 B2* | 8/2014 | Sohmshetty | G05B 19/41805 700/103 |
| 8,890,867 B2* | 11/2014 | Buchowski | G06T 19/20 345/420 |
| 9,374,223 B2* | 6/2016 | Kubota | H04L 9/3234 |
| 9,779,184 B2* | 10/2017 | Winn | G06F 17/50 |
| 9,871,796 B1* | 1/2018 | Sowa | H04L 67/30 |
| 9,971,854 B1* | 5/2018 | Bowen | G06F 17/50 |
| 2001/0047251 A1* | 11/2001 | Kemp | G06F 17/5004 703/1 |
| 2002/0007348 A1* | 1/2002 | Ali | G06Q 10/06 705/51 |
| 2002/0010524 A1* | 1/2002 | Jin | G06F 17/50 700/106 |
| 2002/0035450 A1* | 3/2002 | Thackston | G05B 19/4099 703/1 |
| 2002/0072821 A1* | 6/2002 | Baker | G05B 19/41865 700/98 |
| 2003/0085921 A1* | 5/2003 | Ghosh | B29C 33/3835 715/751 |
| 2003/0090530 A1* | 5/2003 | Ramani | G06F 17/50 715/848 |
| 2003/0139952 A1* | 7/2003 | Lubash | G06Q 10/06 705/7.22 |
| 2003/0217275 A1* | 11/2003 | Bentley | G06F 21/10 713/184 |
| 2004/0073410 A1* | 4/2004 | Maly | G06F 17/5004 703/1 |
| 2004/0075688 A1* | 4/2004 | Cortesi | G06F 17/50 715/763 |
| 2005/0015169 A1* | 1/2005 | Littlejohn | G05B 19/4097 700/108 |
| 2005/0038821 A1* | 2/2005 | Wallen | G05B 19/4097 |
| 2005/0080502 A1* | 4/2005 | Chernyak | G06F 17/50 700/97 |
| 2005/0138566 A1* | 6/2005 | Muller | G06Q 10/00 715/759 |
| 2005/0172260 A1* | 8/2005 | Eichstaedt | G05B 15/02 717/104 |
| 2005/0216429 A1* | 9/2005 | Hertz | G06Q 10/06 |
| 2006/0004472 A1* | 1/2006 | Eichstaedt | G05B 15/02 700/96 |
| 2006/0031049 A1* | 2/2006 | Smith | G06F 17/5095 703/9 |
| 2006/0041503 A1* | 2/2006 | Blair | G06F 17/227 705/37 |
| 2006/0066609 A1* | 3/2006 | Iodice | G06T 19/20 345/419 |
| 2006/0167587 A1* | 7/2006 | Read | B23Q 9/00 700/245 |
| 2006/0265496 A1* | 11/2006 | Freitag | G06F 17/50 709/224 |
| 2006/0282186 A1* | 12/2006 | Hansen | G05B 19/41885 700/97 |
| 2008/0059527 A1* | 3/2008 | Thieme | G05B 19/41875 |
| 2008/0141334 A1* | 6/2008 | Wicker | G06F 17/50 726/1 |
| 2008/0172208 A1* | 7/2008 | Lechine | G06F 17/50 703/1 |
| 2009/0037153 A1* | 2/2009 | Grichnik | G06F 17/5009 703/2 |
| 2009/0259440 A1* | 10/2009 | Reed | G06F 17/50 703/1 |
| 2010/0042676 A1* | 2/2010 | Seroussi | G06F 17/5004 709/203 |
| 2011/0098835 A1* | 4/2011 | Yucel | G06F 17/5095 700/103 |
| 2011/0098837 A1* | 4/2011 | Yucel | G06F 17/5086 700/104 |
| 2011/0172794 A1* | 7/2011 | Sohmshetty | G05B 19/41805 700/97 |
| 2011/0320365 A1* | 12/2011 | Gopalakrishnan | G06Q 10/06312 705/301 |
| 2012/0109591 A1* | 5/2012 | Thompson | G06F 17/50 703/1 |
| 2012/0215336 A1* | 8/2012 | Yucel | G06F 17/5086 700/103 |
| 2012/0215499 A1* | 8/2012 | Yucel | G06F 17/5086 703/1 |
| 2012/0221136 A1* | 8/2012 | Yucel | G06F 17/5086 700/103 |
| 2014/0222387 A1* | 8/2014 | Cannon | G06F 17/5018 703/1 |
| 2014/0278269 A1* | 9/2014 | Winn | G06F 17/50 703/1 |
| 2015/0052025 A1* | 2/2015 | Apsley | G06Q 30/0635 705/26.81 |
| 2016/0026671 A1* | 1/2016 | McConnachie | G06F 16/273 707/613 |
| 2016/0028734 A1* | 1/2016 | Faitelson | H04L 63/101 726/28 |
| 2016/0098494 A1* | 4/2016 | Webster | G06F 17/50 703/1 |
| 2016/0147217 A1* | 5/2016 | Davis | G06F 16/444 700/97 |
| 2017/0171208 A1* | 6/2017 | Purushothaman | H04L 63/104 |
| 2017/0199516 A1* | 7/2017 | DiPippo | G05B 19/41865 |
| 2017/0327247 A1* | 11/2017 | Dike | B64F 5/40 |
| 2017/0337215 A1* | 11/2017 | Bowman | G06F 16/258 |
| 2017/0337296 A1* | 11/2017 | Usevitch | G06F 17/50 |
| 2018/0039253 A1* | 2/2018 | Jacobs, II | G10L 15/22 |
| 2018/0129188 A1* | 5/2018 | Jacobs, II | G06F 17/50 |
| 2019/0087733 A1* | 3/2019 | Dooley | G06N 5/04 |

* cited by examiner

FIG. 5A
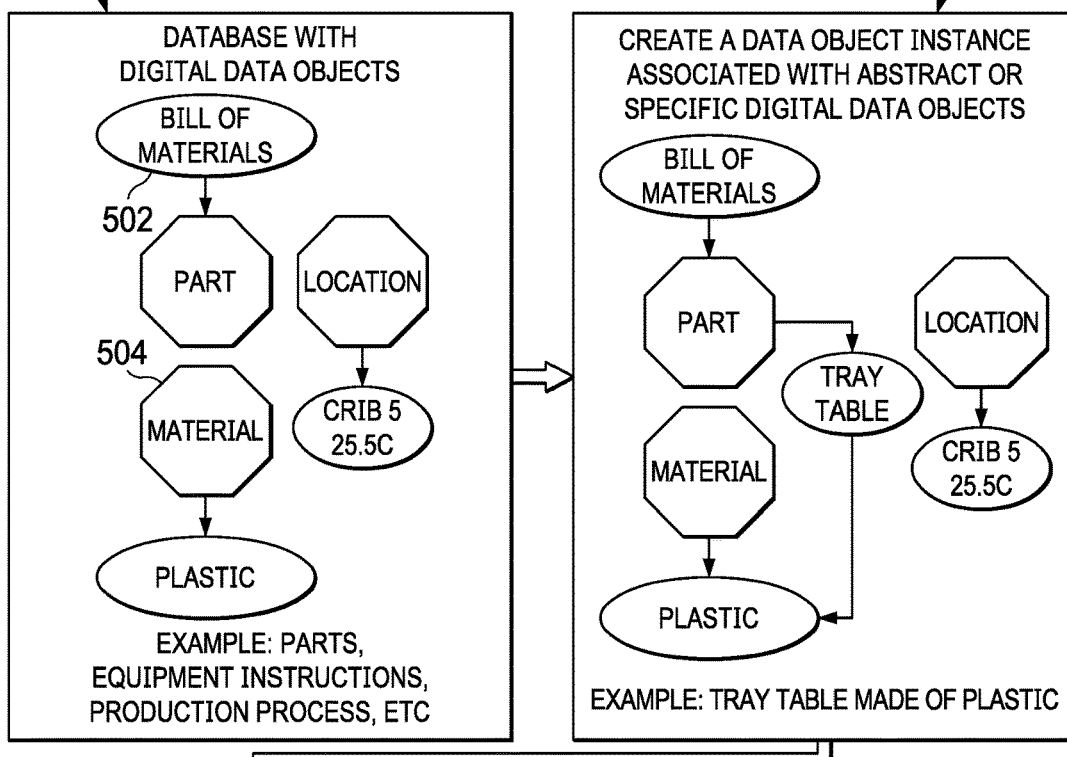
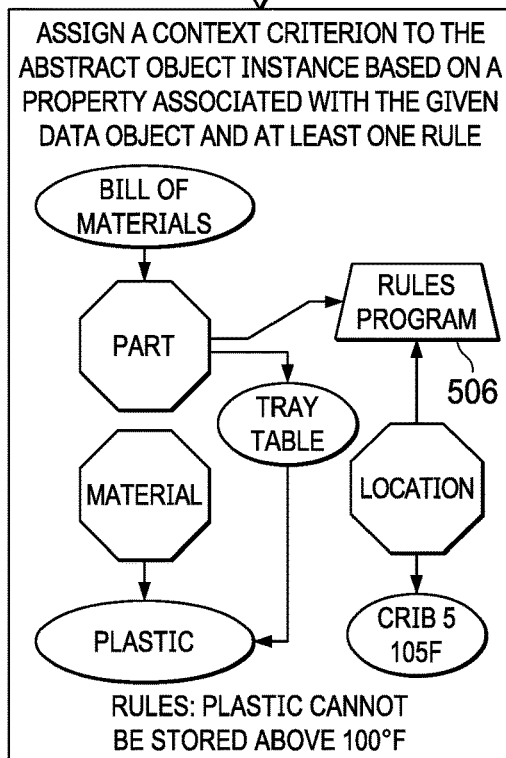
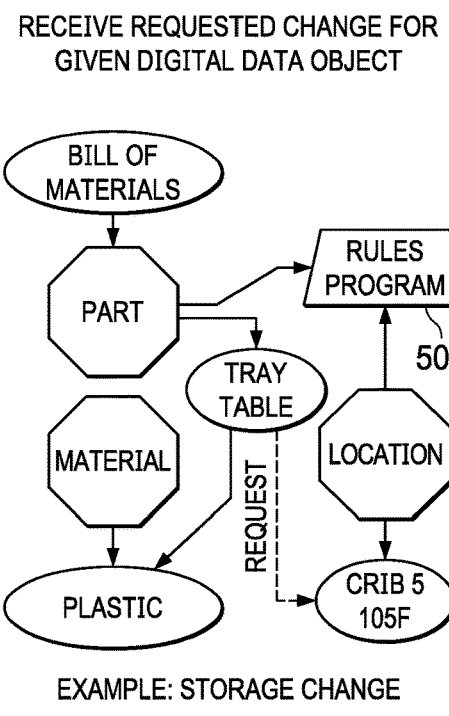

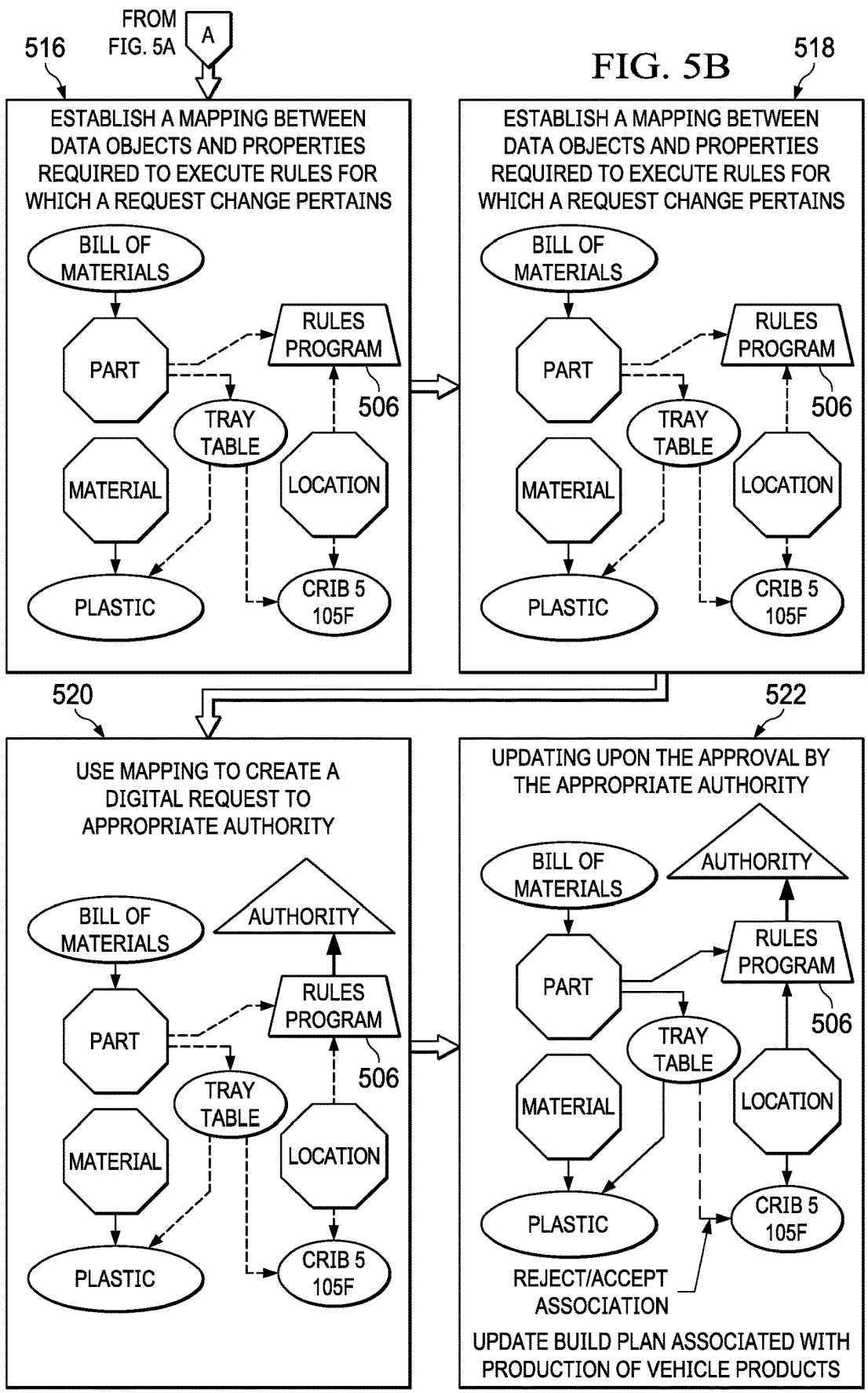

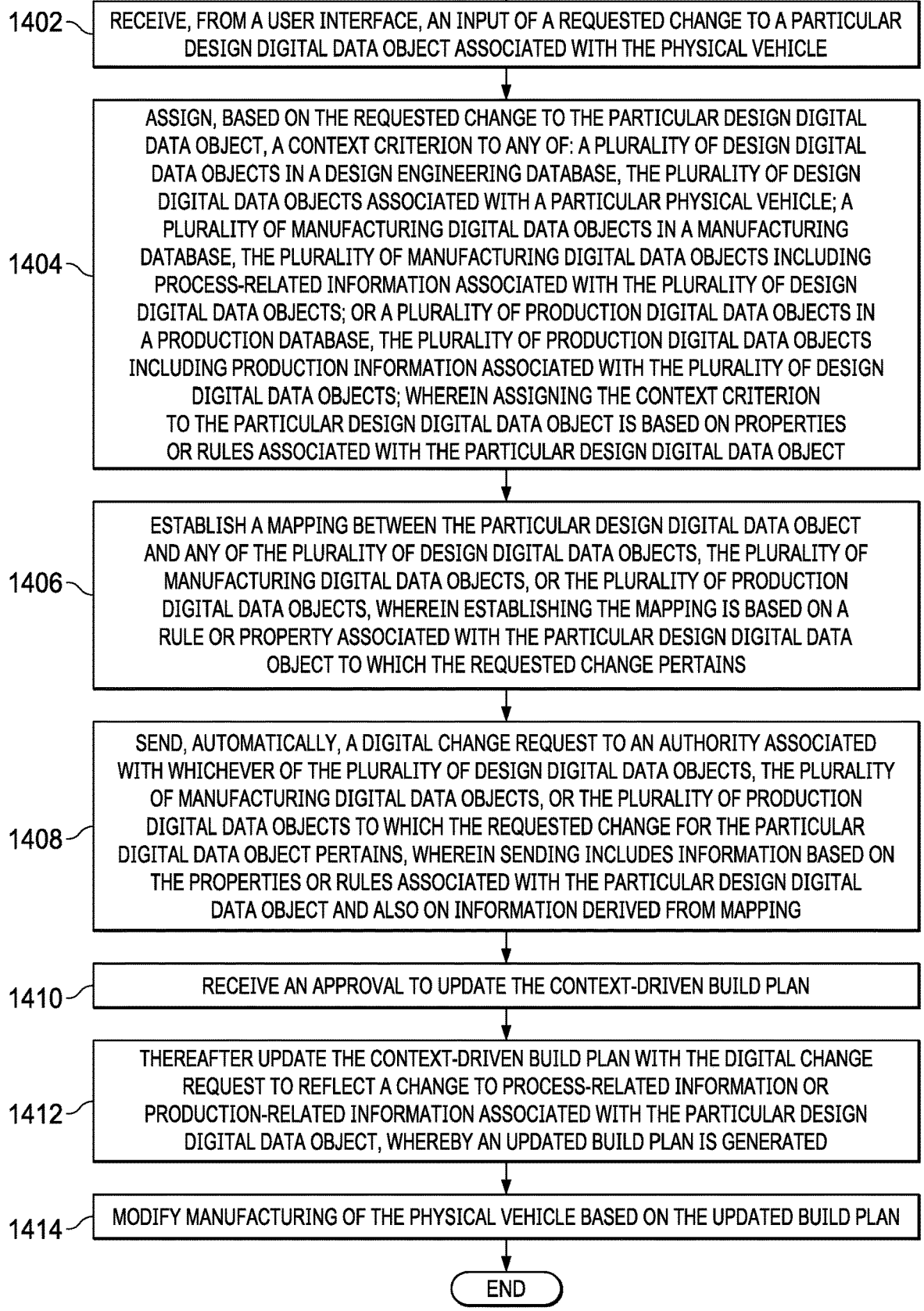

AUTOMATED CONTEXT DRIVEN BUILD PLAN LIFECYCLE

BACKGROUND INFORMATION

1. Field

The present disclosure relates to devices and methods for creating automated context driven build plans for manufacturing physical objects, particularly aircraft.

2. Background

Building complex things can be difficult because managing a large number of parts and their interoperability, together with managing the people who make and assemble them, is very challenging. For example, a commercial jet aircraft may have more than six million parts, all of which have to be manufactured and assembled by teams of workers that number in the hundreds, or even thousands, when all stages of the procurement, manufacturing, assembly, and testing processes are taken into account. Similar considerations occur in the construction of large, complex buildings, or other types of machines.

Today, in the aircraft manufacturing industry, manual processes and tools are used to populate build data and context for the build data with respect to the planning and monitoring of aircraft manufacturing. In other words, even though computerized software tools are used to plan and monitor the manufacturing of aircraft, ultimately such planning is still considered to be manual because a human must track the overall build plan lifecycle and manually input data such as plan progress and plan changes into the computer. Stated still differently, the computer may provide a convenient way to store and search data, but ultimately the build plan lifecycle remains a manual operation. Due to the complexity of issues surrounding a build plan lifecycle for a complex machine, such as a real commercial aircraft, today's computers simply cannot automate the build plan or implement changes to the build plan.

For example, current build plan creation and monitoring, that is the build plan lifecycle, requires extensive manual effort in the interrogation of segregated digital data. The build plan uses a gated-lock-in process where changes to the build plan are submitted to a cross-functional change board, composed of human subject matter experts, for approval and implementation of decisions. The layers of rigid enforcement create delays, cause rework of components, and can obscure down-stream requirements or constraints. If one of the items in the build plan flow were to function in a less than desirable manner, then the whole manufacturing process may be affected. Additionally, affected parties may not be made aware of issues that arise because information is flowing only in one direction; that is, to the change board and not outwardly to other teams responsible for related aspects of manufacturing the aircraft.

Thus, despite the ubiquitous use of computers in aircraft manufacturing, the fact is that the build plan lifecycle remains essentially a manual process which imposes time and cost inefficiencies in the manufacturing of aircraft and other complex machines. This fact represents a long-felt, but unsolved, need in the aircraft manufacturing industry and in other industries which manufacture or construct highly complex objects.

SUMMARY

The illustrative embodiments provide for a control system for updating a context-driven build plan for production of a physical vehicle. The control system includes a design engineering database having a plurality of design digital data objects associated with a particular physical vehicle. The control system also includes a manufacturing database having a plurality of manufacturing digital data objects that include process-related information associated with the plurality of design digital data objects. The control system also includes a production database having a plurality of production digital data objects that include production information associated with the plurality of design digital data objects. The control system also includes a criterion module configured to assign a context criterion to any of the plurality of design digital data objects, the plurality of manufacturing digital data objects, or the plurality of production digital data objects, wherein the criterion module is further configured to assign the context criterion to a particular design digital data object based on properties and/or rules associated with the particular design digital data object. The control system also includes a user interface configured to receive an input of a requested change for the particular design digital data object associated with the physical vehicle. The control system also includes a mapping module configured to establish a mapping between the particular design digital data object and any of the plurality of design digital data objects, the plurality of manufacturing digital data objects, or the plurality of production digital data objects, wherein the mapping module is configured to establish the mapping based on the properties and/or rules associated with the particular design digital data object to which the requested change pertains, and wherein the mapping module is further configured to automatically send a digital change request to an authority associated with whichever of the plurality of design digital data objects, the plurality of manufacturing digital data objects, or the plurality of production digital data objects to which the requested change for the particular digital data object pertains, wherein automatic sending includes information based on the properties and/or rules associated with the particular design digital data object and also on information derived from mapping. The control system also includes a change module configured, upon approval by the authority, to update the context-driven build plan with the digital change request to reflect a change to process-related information or production-related information associated with the particular digital data object, whereby an updated build plan is generated.

The illustrative embodiments also provide for a method for updating a context-driven build plan for production of a physical vehicle. The method includes receiving, from a user interface, an input of a requested change to a particular design digital data object associated with the physical vehicle. The method also includes assigning, based on the requested change to the particular design digital data object, a context criterion to any of: a plurality of design digital data objects in a design engineering database, the plurality of design digital data objects associated with a particular physical vehicle; a plurality of manufacturing digital data objects in a manufacturing database, the plurality of manufacturing digital data objects including process-related information associated with the plurality of design digital data objects; or a plurality of production digital data objects in a production database, the plurality of production digital data objects including production information associated with the plurality of design digital data objects; wherein assigning the context criterion to the particular design digital data object is based on properties and/or rules associated with the particular design digital data object. The method also includes establish a mapping between the particular design digital data object and any of the plurality of design digital data objects, the plurality of manufacturing digital data objects, or the plurality of production digital data objects, wherein establishing the mapping is based on the properties and/or rules associated with the particular design digital data object to which the requested change pertains. The method also includes sending, automatically, a digital change request to an authority associated with whichever of the plurality of design digital data objects, the plurality of manufacturing digital data objects, or the plurality of production digital data objects to which the requested change for the particular digital data object pertains, wherein sending includes information based on the properties and/or rules associated with the particular design digital data object and also on information derived from mapping. The method also includes receiving an approval to update the context-driven build plan. The method also includes, thereafter, updating the context-driven build plan with the digital change request to reflect a change to process-related information or production-related information associated with the particular design digital data object, whereby an updated build plan is generated.

The illustrative embodiments also provide for a method for more efficiently manufacturing a physical vehicle by using an updating of a context-driven build plan for production of the physical vehicle. The method includes receiving, from a user interface, an input of a requested change to a particular design digital data object associated with the physical vehicle. The method also includes assigning, based on the requested change to the particular design digital data object, a context criterion to any of: a plurality of design digital data objects in a design engineering database, the plurality of design digital data objects associated with a particular physical vehicle; a plurality of manufacturing digital data objects in a manufacturing database, the plurality of manufacturing digital data objects including process-related information associated with the plurality of design digital data objects; or a plurality of production digital data objects in a production database, the plurality of production digital data objects including production information associated with the plurality of design digital data objects; wherein assigning the context criterion to the particular design digital data object is based on properties or rules associated with the particular design digital data object. The method also includes establish a mapping between the particular design digital data object and any of the plurality of design digital data objects, the plurality of manufacturing digital data objects, or the plurality of production digital data objects, wherein establishing the mapping is based on the properties or rules associated with the particular design digital data object to which the requested change pertains. The method also includes sending, automatically, a digital change request to an authority associated with whichever of the plurality of design digital data objects, the plurality of manufacturing digital data objects, or the plurality of production digital data objects to which the requested change for the particular digital data object pertains, wherein sending includes information based on the properties or rules associated with the particular design digital data object and also on information derived from mapping. The method also includes receiving an approval to update the context-driven build plan. The method also includes, thereafter, updating the context-driven build plan with the digital change request to reflect a change to process-related information or production-related information associated with the particular design digital data object, whereby an updated build plan is generated. The method also includes modifying manufacturing of the physical vehicle based on the updated build plan.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIGS. 5A-5B are an illustration of flowcharts of an example of a context driven process flow for the example shown in FIG. 4, in accordance with an illustrative embodiment;

FIG. 14 is an illustration of a block diagram of a method for more efficiently manufacturing a physical vehicle by using an updating a context-driven build plan for production of the physical vehicle, in accordance with an illustrative embodiment;

DETAILED DESCRIPTION

Figure 1:
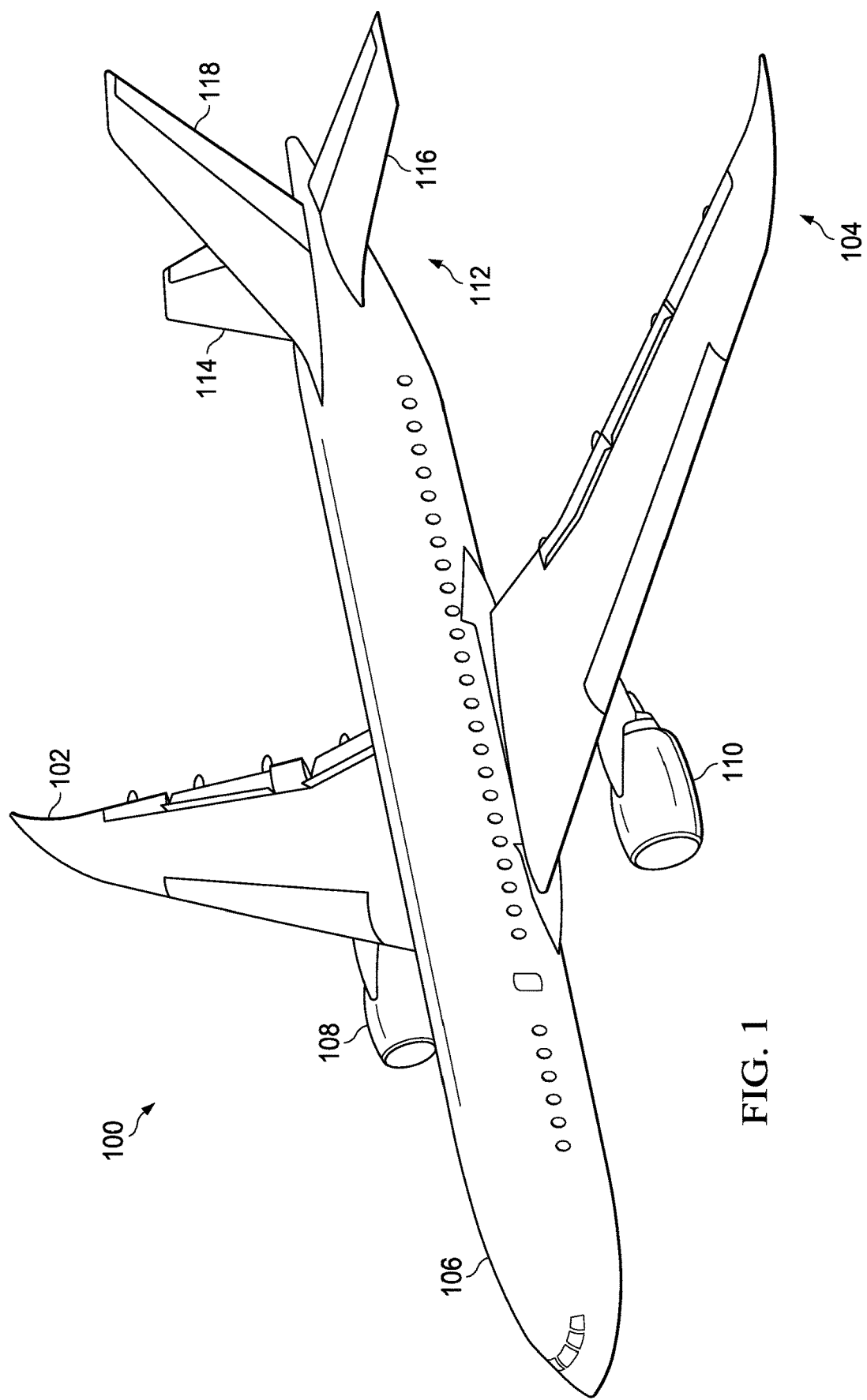
FIG. 1 is an illustration of an aircraft which may be manufactured according to the illustrative embodiments described herein.

The illustrative embodiments recognize and take into account that, today, the industry uses manual processes and tools to populate build data and context for a build plan lifecycle. This current method drives extensive manual effort in the interrogation of the segregated digital data.

However, the illustrative embodiments provide for an automated context driven build plan lifecycle. An automated contextual driven build plan provides a method for dynamic consumption of structure data and logic to provide just-in-time compilation of every individual process.

The automated contextual driven build plan of the illustrative embodiments provides a method for dynamic consumption of structure data and logic to provide just-in-time compilation of every individual process. This method connects the digital data throughout the value stream and minimizes touch time through automated interrogation.

Returning to conventional practices, today, a build plan uses a gated-lock-in process where changes are submitted to a cross functional change board for approval and implementation of decisions. The layers of rigid enforcement create delays, may create rework of components, and may obscure down-stream requirements or constraints. If one of the items within the flow were to have a problem and stop functioning correctly, the whole process may be affected. In most cases the affected parties are not made aware of the issue because information is flowing in one direction.

However, the illustrative embodiments manage content in digital and visual environment that allows the user to see the build plan at a process plan level and to see respective digital data objects. This method allows for the user to see the content of the build plan with respect to the parts as a whole, and context parts added to each stage or iteration of the build plan.

Attention is now turned to describing a build plan lifecycle. A build plan describes the integrated technical artifacts that are the basis for fabrication (FAB), assembly (Assy), installation, manufacturing resources (tools, transport, consumables, etc.), flow of parts, execution metrics, inspection, test, resource states, job states, configuration management and history of the product throughout the product life cycle. The build plan lifecycle is a highly integrated process with tightly integrated dependencies. Each step of the build process requires a massive combination of contextual data that is currently maintained by manual, gated processes.

The illustrative embodiments also recognize and take into account that this process architecture produces build plan information requiring research and verification to the end user for many elements of the build plan. Information is delivered to the factory mechanic or other worker in the form of work instructions which are more of an organized appendix with supporting graphics, referring the end user to the source location rather than actually providing the data.

The illustrative embodiments also recognize and take into account that industry build plans are currently limited by single function applications that tier content distribution downstream. This fact forces consumption of information into a linear approach for filtering, additions, and transformation. Currently, processes, documents, and change boards are used to evaluate designs for spatial integration and asses risk to develop the build plan. The final approvals are documented in silo environments and remain uninfluenced by the maturation of the entire build plan lifecycle. These aspects of the current build plan lifecycle are less than desirable.

In contrast, an automated contextual driven build plan, as described below with respect to the illustrative embodiments, provides a method for dynamic consumption of structure data and logic to provide just-in-time compilation of every individual process. Thus, the illustrative embodiments represent a significant advance over existing procedures.

FIG. 1 illustrates an aircraft which may be manufactured according to the illustrative embodiments described herein. In this illustrative example, aircraft 100 has wing 102 and wing 104 attached to body 106. Aircraft 100 includes engine 108 attached to wing 102 and engine 110 attached to wing 104. Aircraft 100 could be any other aircraft, such as a prop aircraft, a helicopter, or some other moveable platform such as an automobile, boat, or even a building.

Aircraft 100 may have other features. For example, body 106 has tail section 112. Horizontal stabilizer 114, horizontal stabilizer 116, and vertical stabilizer 118 are attached to tail section 112 of body 106. Aircraft 100 may be manufactured according to the devices and techniques described with respect to FIG. 2 through FIG. 16.

Figure 2:
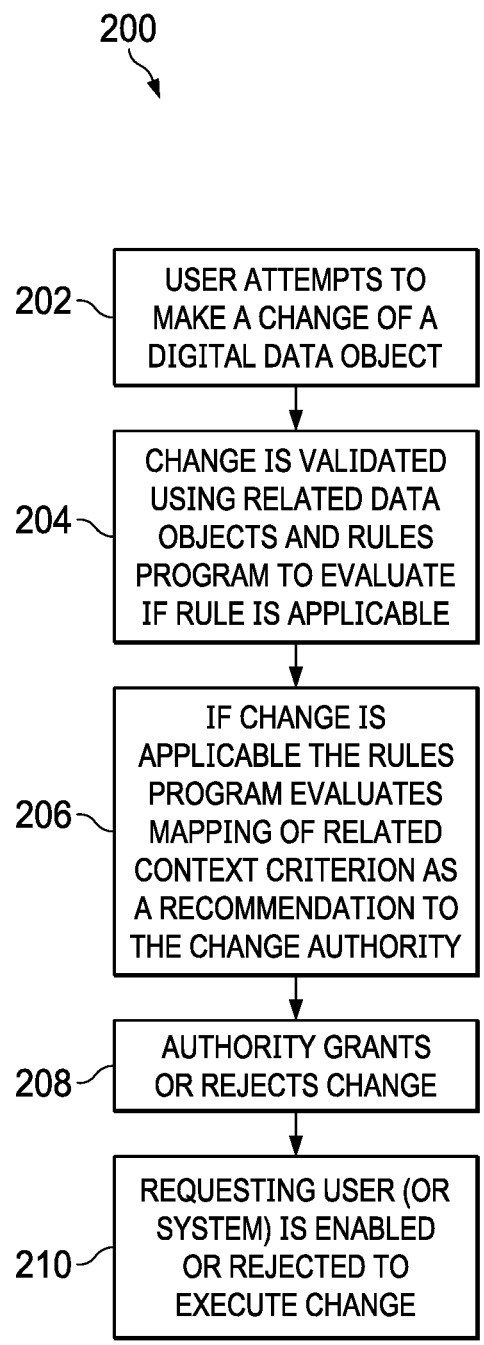
FIG. 2 is an illustration of a block diagram of a build plan and change build plan authoring sequence, in accordance with an illustrative embodiment.

FIG. 2 illustrates a build plan and change build plan authoring sequence, in accordance with an illustrative embodiment. This build plan and change plan authoring sequence can be used in the manufacture of an aircraft, such as aircraft 100 of FIG. 1, or any component of the aircraft, or any other complex machine. Thus, authoring sequence 200 may be considered a means to manufacture an aircraft. Additionally, authoring sequence 200 is supported by rules and data structures, as described with respect to FIG. 3 through FIG. 14, which represent a technical effect or a technological improvement to the current capabilities of computers, especially with respect to computers as used in a manufacturing environment.

Authoring sequence 200 represents a method for implementing a change to a build plan. A build plan includes a strategy (applies to product development or airplane development) and sets the requirements for a system level build plan. The system level build plan includes information such as industrial partnering, assembly and integration site traits, relocation agility, affordability constraints, etc.

A build plan also includes a design, which is one of the drivers or contributors to a number of build plan decisions. Thus, for example, a design may apply to programs, product development, and airplane development. The design may define transportation, make-buy, resource allocation, disruption management, product performance expectations, product activity nodes (control station network), as-built accounting methods, and verification. Many other factors contribute to the design, such as but not limited to costs, locations, distances, offsets, availabilities, capacities, etc.

A build plan also includes the plan itself. The plan incorporates physical and functional requirements to achieve an optimal design, and the integration of factors such as maintainability, reliability, safety, and security to meet cost, performance, and schedule objectives.

A build plan also includes a build process. A build process includes logistic management for volume, integration, and shop floor control. A build process describes the spatial and chronological relationships in the assembly of the airplane where major portions are brought together. This build process includes interfaces between end items and commodity interfaces within end items. The build process includes a build context that provides instructions that identify resources required, work artifacts, time defined objective, quality artifacts, and design requirements.

An automated contextual driven build plan, such as that described further below, provides a method for dynamic consumption of structure data and logic to provide just-in-time compilation of every individual build plan or build process associated with the manufacturing of a complex product, such as an aircraft, a building, or some other complex machine. Thus, the illustrative embodiments represent a significant advancement over the manual build plan lifecycle described above.

Authoring sequence 200 represents a broad overview of the illustrative embodiments. Authoring sequence 200 includes a number of operations. First a user attempts to make a change of a digital data object (operation 202). A digital data object is defined further below.

Then, the computer validates the change using related data objects and a rules program to evaluate if a rule is applicable (operation 204). The term "a rules program" contemplates both one rule and more than one rule. If the change is applicable, the rules program evaluates mapping of related content criterion as a recommendation to the change authority (operation 206). Again, the change authority is one or more humans who review the recommendation transmitted via the computer. The change authority may be an automatic process depending on the change, context, level of impact, or the originating requestor of the change.

The change authority grants or rejects the change (operation 208) using a message transmitted through the computer. The requesting user or system is then enabled to execute the change, or is informed that the change is rejected (operation 210). In one illustrative embodiment, the authoring sequence 200 may terminate thereafter.

Figure 3:
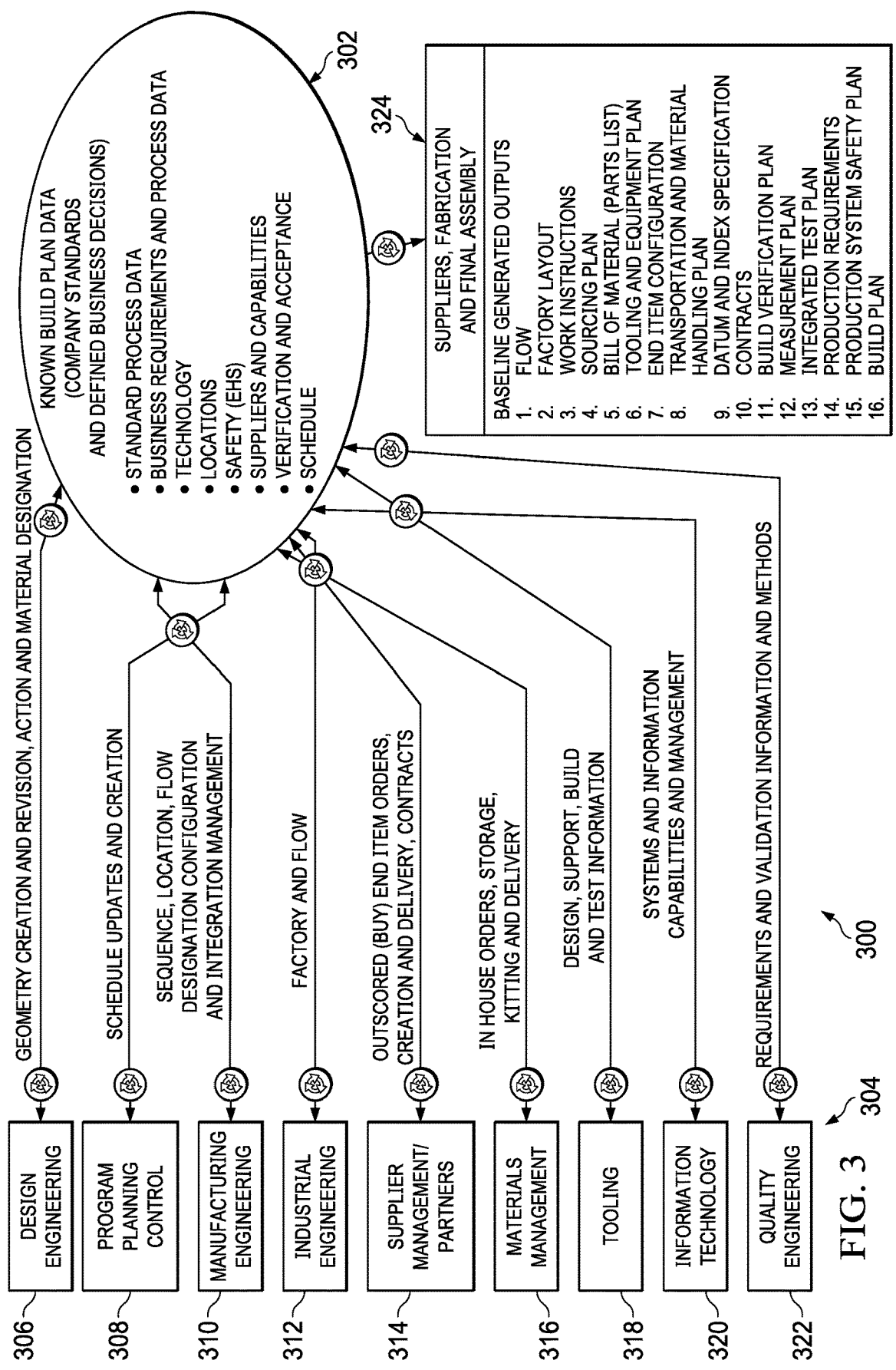
FIG. 3 is an illustration of a flowchart of a context criterion used within a rule set to evaluate the build process compilation, in accordance with an illustrative embodiment.

FIG. 3 illustrates context criterion used within a rule set to evaluate the build process compilation, in accordance with an illustrative embodiment. Process 300 represents further detail regarding the automated build plan lifecycle, particularly with respect to operation 204 and operation 206 of FIG. 2.

Process 300 shows the context criterion used within a rule set to evaluate the build process compilation. A valuable feature of process 300 is that data flows both ways when a change request triggers an affected context.

Contexts are dynamic properties that can be attached to any stage of the build process. Contexts can both be data and logic. This property of contexts allows a context to represent a given property, such as spatial position relative to the factory floor, a step within a list of instructions, location of a hazardous material, alternative resources given constraints, or other properties or actions.

Contexts of the build plan allow the affected organizations to manage content in a digital and visual environment that allows the user to see the build plan at all levels of the production system (such as the process plan, position of a product being assembled, control station for the product, code used in making the product, and factory information regarding the product). Contexts allow a digital interrogation of the data by all affected organizations that would drive first pass quality into our designs at early stages. The digital representation updates with the changes to the configuration and always represent the approved version.

Logic contexts can be used to drive dependency, exclusivity and/or states of the build plan. This feature allows context to describe the relationship to other contexts and even unknown conditions.

The computer system uses contexts to calculate all of the available affected areas that could be affected by the engineering change through the value stream of the as planned, as supplied, and as built. The end result will be a single and/or provide various recommended options, laid out for the approved change board or other authority to review and/or accept based on some context and/or business factors.

When the approval comes from the change board authority to accept an option, the system executes the necessary system changes, updating the build plan and production facilities. These changes include area changes, changes to machines, changing to machining process, and/or storage of materials.

Example process with digital data objects and properties, shown below with respect to FIG. 4 through FIG. 11, together with relationships represent the context criterion. These context criteria may be applied against the rules program to evaluate applicability, and if deemed applicable are then evaluated to determine recommendation to the change authority. Once granted by the change authority, the requesting system is granted execution for the authoring of the build plan.

FIG. 3, in particular, shows use of an automated context driven build plan. Process 300 includes build plan data 302 stored in one or more databases, preferably in a distributed computing environment. Multiple different teams, such as teams 304, contribute to and modify build plan data 302. Note that while nine teams or groups are shown, the illustrative embodiments contemplate more or fewer groups, depending on a particular project. Additionally, each of the teams shown below may, themselves, be subdivided in to multiple different teams. Thus, the following teams are exemplary only and do not necessarily limit the claimed inventions.

Teams 304 include design engineering team 306. Design engineering team 306 provides, via user input devices, geometry creation and revision services, action and material designation services, and possibly other services to build plan data 302.

Teams 304 also include program planning and control team 308. Program planning and control team 308 provides, via user input devices, scheduling creation and update services to build plan data 302, as well as other services.

Teams 304 also include manufacturing engineering team 310. Manufacturing engineering team 310 provides, via user input devices, sequence, location, and flow designation for manufacturing the product to build plan data 302. Manufacturing engineering team 310 also provides, via user input devices, configuration and integration management, as well as other services, to build plan data 302.

Teams 304 also include industrial engineering team 312. Industrial engineering team 312 provides, via user input devices, factory, and flow information to build plan data 302.

Teams 304 also include supplier management and partner teams 314. Supplier management and partner teams 314 may be a wide assortment of different vendors and partners that cooperate with the main entity responsible for manufacturing the complex product, as well as the persons and systems responsible for managing these disparate groups. Supplier management and partner teams 314 provide, via user input devices, information about outsourced end order items, the creation and delivery of products and services, as well as information regarding the coordination of contracts, to build plan data 302.

Teams 304 also include materials management team 316. Materials management team 316 provides, via user input devices, in house order information, storage information, kitting information, and delivery of materials information, as well as other related information, to build plan data 302.

Teams 304 also includes tooling team 318. Tooling team 318 provides, via user input devices, design, support, building services, testing services, and related services and information to build plan data 302.

Teams 304 also include information technology team 320. Information technology team 320 provides, via user input devices, system and information data, capabilities and management data, as well as other information technology related information to build plan data 302.

Teams 304 also include quality engineering team 322. Quality engineering team 322 may provide, via user input devices, requirements and validation data, as well as methods information, and related information, to build plan data 302.

Thus, build plan data 302 includes a wide assortment of data that is continually created and updated by possibly a vast array of different sources. The illustrative embodiments coordinate build plan data 302 in order to create an automated build plan lifecycle, particularly when updates are made to build plan data 302. However, because build plan data 302 includes all, or subset of all, of the relevant information related to the manufacture and delivery of a complex machine such as an aircraft, the illustrative embodiments are able to notify each other team of the impact of an authorized change request.

Thus, for example, if design engineering team 306 submits a change request to a part, and the change request is approved, then tooling team 318 may automatically receive a notice of the change. The tooling team 318, now aware of this change, not only may implement the change more quickly, but automatically receives all of the data necessary for tooling team 318 to implement the requested change. At the same time, the other teams are also automatically appraised of changes to their tasks based on the approved change. Accordingly, the illustrative embodiments provide for an automated build plan lifecycle that dramatically increases the efficiency of manufacturing a complex machine, such as an aircraft.

Further, as shown at area 324, an overall manager, or anyone else who is authorized and desires the information, can observe the entire manufacturing process from a macro level by accessing build plan data 302. Additionally, such a visual display may be updated in real time as changes are made, possibly with such changes highlighted. In this manner, the illustrative embodiments also present an improved method of presenting complex data such that a technical improvement in a computer is achieved. In other words, another technical improvement to the illustrative embodiments is not only the management of data, but also the presentation of data for easier consumption by a human user.

Figure 4:
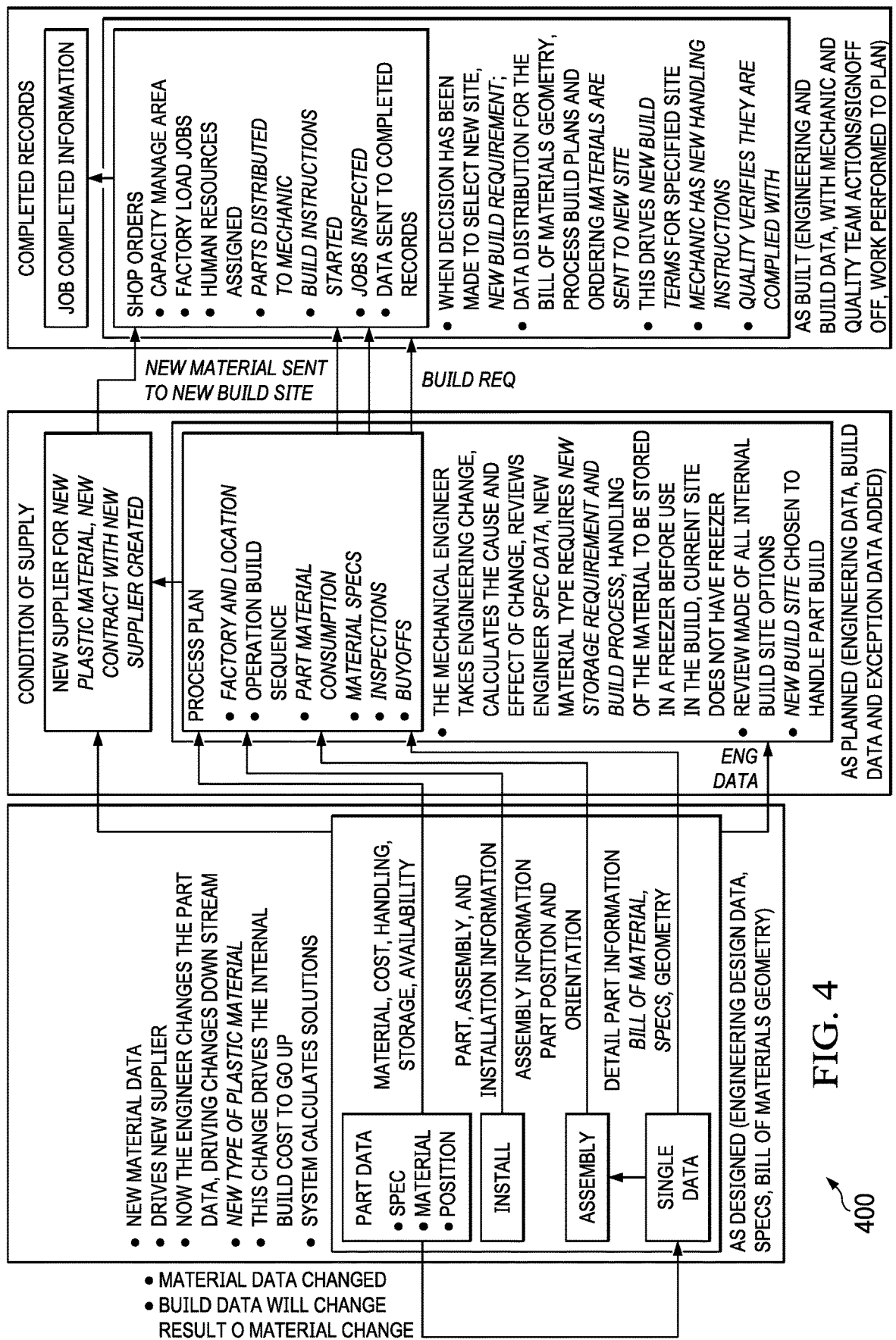
FIG. 4 is an illustration of a block diagram of an example of a process flow for a change of build plan, in accordance with an illustrative embodiment.

FIG. 4 illustrates an example of a process flow for a change of build plan, in accordance with an illustrative embodiment. Thus, process flow 400 is a specific example of process 300 shown in FIG. 3. In particular, process flow 400 relates to the storing of a tray table part, made of plastic, to a given location. As used in FIG. 4, the term "BOM" means "bill of materials". The term "GEOM" means "geometry". The term "eng" means "engineering". The term "ME" means "manufacturing engineer".

FIG. 5 illustrates an example of a context driven process flow for the example shown in FIG. 4, in accordance with an illustrative embodiment. Process flow 500 may be used specifically in relation to process flow 400 show in FIG. 4. Specifically, process flow 400 shows how the building blocks of data object instances, abstract data objects, and rules programs interrelate with each other in the automated build plan lifecycle of the illustrative embodiments. Again, the context criterion and rules relationship for enabling process change is provided in the context of "parts made of plastic stored in a given location."

As used in FIG. 5, the term "BOM" means "bill of materials". The term "CRIB" means refers to a storage location for parts and tools.

Circles or ellipses in FIG. 5, such as bill of materials 502 (BOM), are data object instances. Data object instances contain properties and relationships to instruct build dependencies, line configurations, alternative relationships, etc. These relationships are expressed with the line coming from the data object instances.

Hexagons represent abstract data objects, such as material 504. Abstract data objects are used to describe generic rules to a group of data objects instances. Abstract data objects are also used to translate data and map the expected data for the rules program. The lines from the abstract data objects represent rule relationships that may or may not apply depending on the rules program in question.

Trapezoids represent rules programs, such as rules program 506. The rules programs have three functions: runtime execution, mapping execution and rules execution. The runtime execution evaluates the results from the rules execution and follows pre-set instructions or executes the instructions determined by the rules program.

A rules program has two set of instructions. A first set of instructions includes premises used to determine if a rule applies given current configuration. A second set of instructions include instructions for an instructional evaluation that force a specific action or restriction.

For example, premises with instruction: part not exist location—evaluates if a part is at that location or not. If it does, then continue to the next instruction, else do not apply the rule. An example of instructional evaluation with instruction may be: part: NOT EXIST: location, which forces that a part cannot exist at a location. A user trying to assign a part to a location will be rejected by the system. In this manner, the control of part locations can be automatically controlled by the automated build plan lifecycle system. In a similar manner, other aspects of the build plan can be controlled.

Attention is now turned to the process flow for this specific example. Initially, a database is provided that stores digital data objects (operation 508). For example, parts, equipment instructions, production processes, and other information are all stored as digital data objects which are each independently stored and treated as its own data structure. This modularity of storing information as digital data objects is a technical feature which helps allow the later mapping between objects, as well as and the association of digital data objects with other types of data objects.

Next, the computer or computers create a data object instance associated with abstract data objects or specific (particular) digital data objects (operation 510). In this particular example, a particular digital data object is a "table tray" which has, among many different properties, the property of "being made of plastic." This property will be used in the mapping to other objects to discover limitations and or rules on the storage temperature requirements of this type of plastic materials.

Next, the computer or computers assign a context criterion to an abstract object instance based on a property associated with the particular digital data object and at least one rule (operation 512). In this particular example, as mentioned above, the rule is that this type of plastic may not be stored at a temperature above 100 degrees Fahrenheit.

Next, the computer or computers receive a requested change for the particular digital data object (operation 514). In this particular example, a storage change is requested. For example, a manufacturing team may wish to have the plastic trays stored closer to a point of manufacture of the overall complex machine, such as the aircraft.

Next, the computer or computers establish a mapping between data objects and properties required to execute rules for which a request change pertains (operation 516). This process is shown in detail in FIG. 5. This process may repeat. Thus, for example, another mapping operation may occur at operation 518. Additional such mapping operations are updated and/or repeated as needed.

Next, the computer or computers use the mapping to create a digital request to an appropriate authority (operation 520). Typically the authority is one or more human subject matter experts entrusted with determining whether the change request should be accepted. However, the authority may be an automated process that evaluates the change request based on the rules program and/or possibly other rules. The context driven process flow would assign a context criterion to the design digital data object associating the property of the plastic and the rule that this type of plastic may not be stored at a temperature above 100 degrees Fahrenheit. A mapping is established between the particular digital data object and associated plastic property and storage rule, where the change request includes information based on the properties and rules and optionally information derived from the mapping regarding potential storage locations meeting the storage temperature rule requirement, for review and acceptance by the appropriate authority. Thus, the entire process may be automated in some illustrative embodiments.

Next, the computer or computers update the build plan data, such as build plan data 302 of FIG. 3, upon approval by the appropriate authority (operation 522). The build plan data 302 may also be updated if the change request is rejected, such as by notifying the requesting team and/or other teams that the trays may not be stored at the desired location due to violation of the rule that the trays not be stored at a location where the temperature may exceed 100 degrees Fahrenheit.

Again, the example provided with respect to FIG. 4 and FIGS. 5A-5B is only a specific example used to highlight operation of the illustrative embodiments described herein. Many other examples are contemplated.

Figure 6:
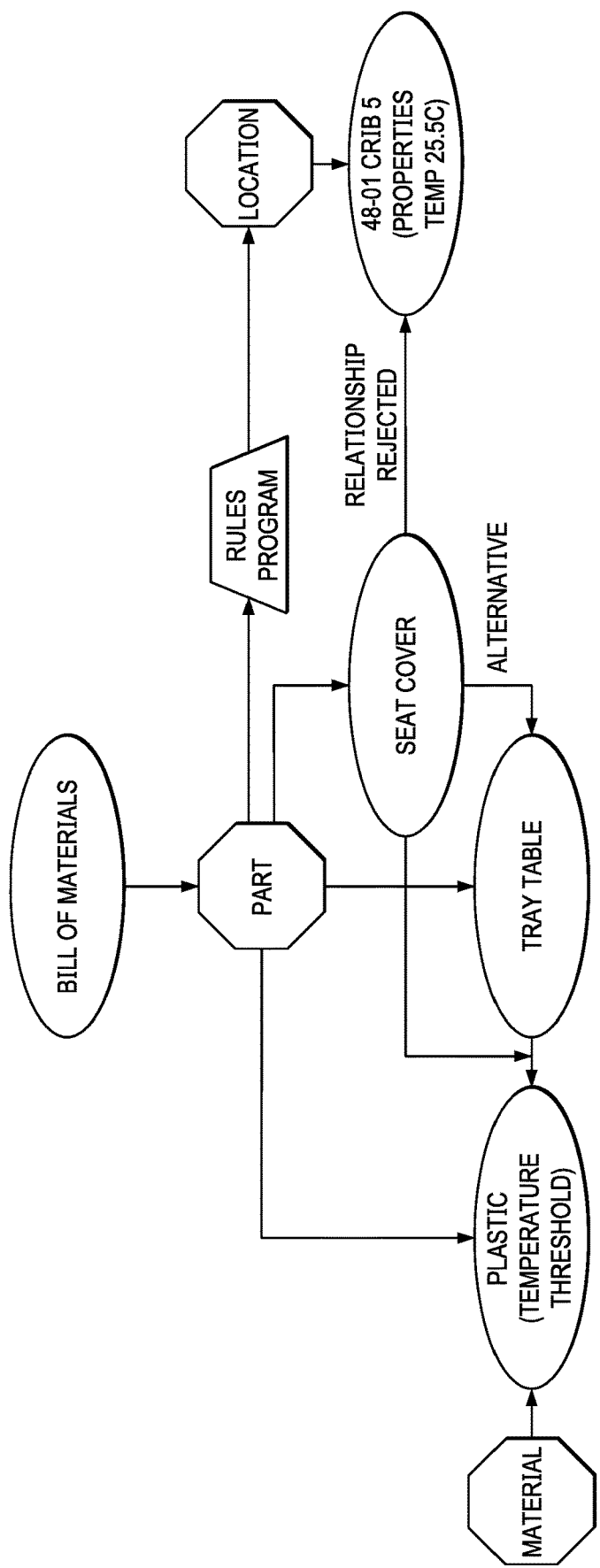
FIG. 6 is an illustration of a flowchart of an example of instructional evaluation of relationships from the rules program relative to the examples shown in FIG. 4 and FIGS. 5A-5B, in accordance with an illustrative embodiment.

FIG. 6 illustrates an example of instructional evaluation of relationships from the rules program relative to the examples shown in FIG. 4 and FIGS. 5A-5B, in accordance with an illustrative embodiment. These relationships are created and evaluated at runtime based on the current context. The geometrical shapes shown in FIG. 6 have similar descriptions and properties such as those shown in FIGS. 5A-5B. Again, FIG. 6 is presented in the context of a change request to move the storage location of plastic seat trays used in the manufacture of a complex machine, such as an aircraft.

Figure 7:
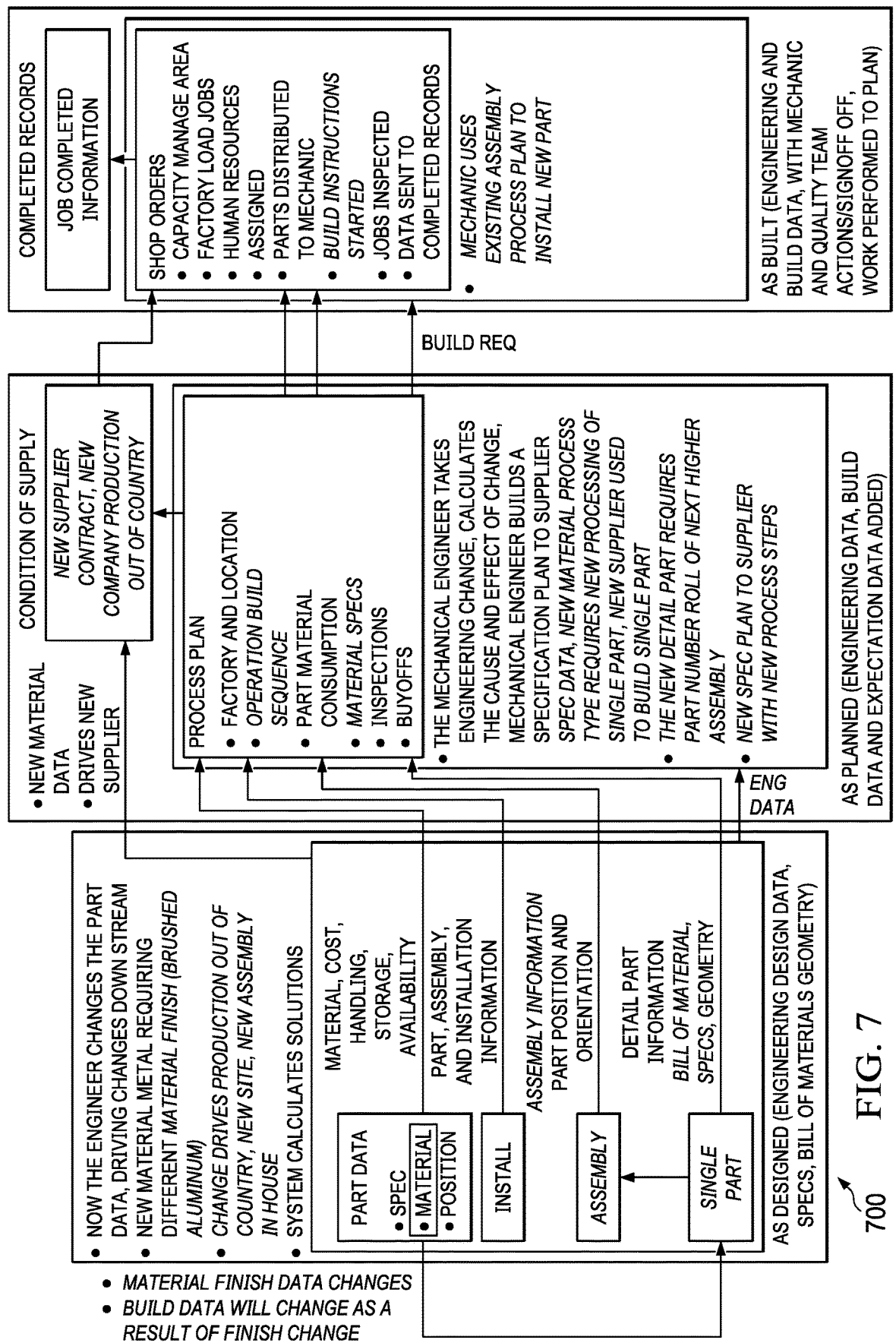
FIG. 7 is an illustration of a block diagram of another example of a process flow for another change of build plan, in accordance with an illustrative embodiment.

FIG. 7 illustrates another example of a process flow for another change of build plan, in accordance with an illustrative embodiment. Process flow 700 is a variation of the example shown in FIGS. 5A-5B and FIG. 6. However, in this illustrative embodiment, a change request is made to change a material type from metal to brushed aluminum.

Figure 8:
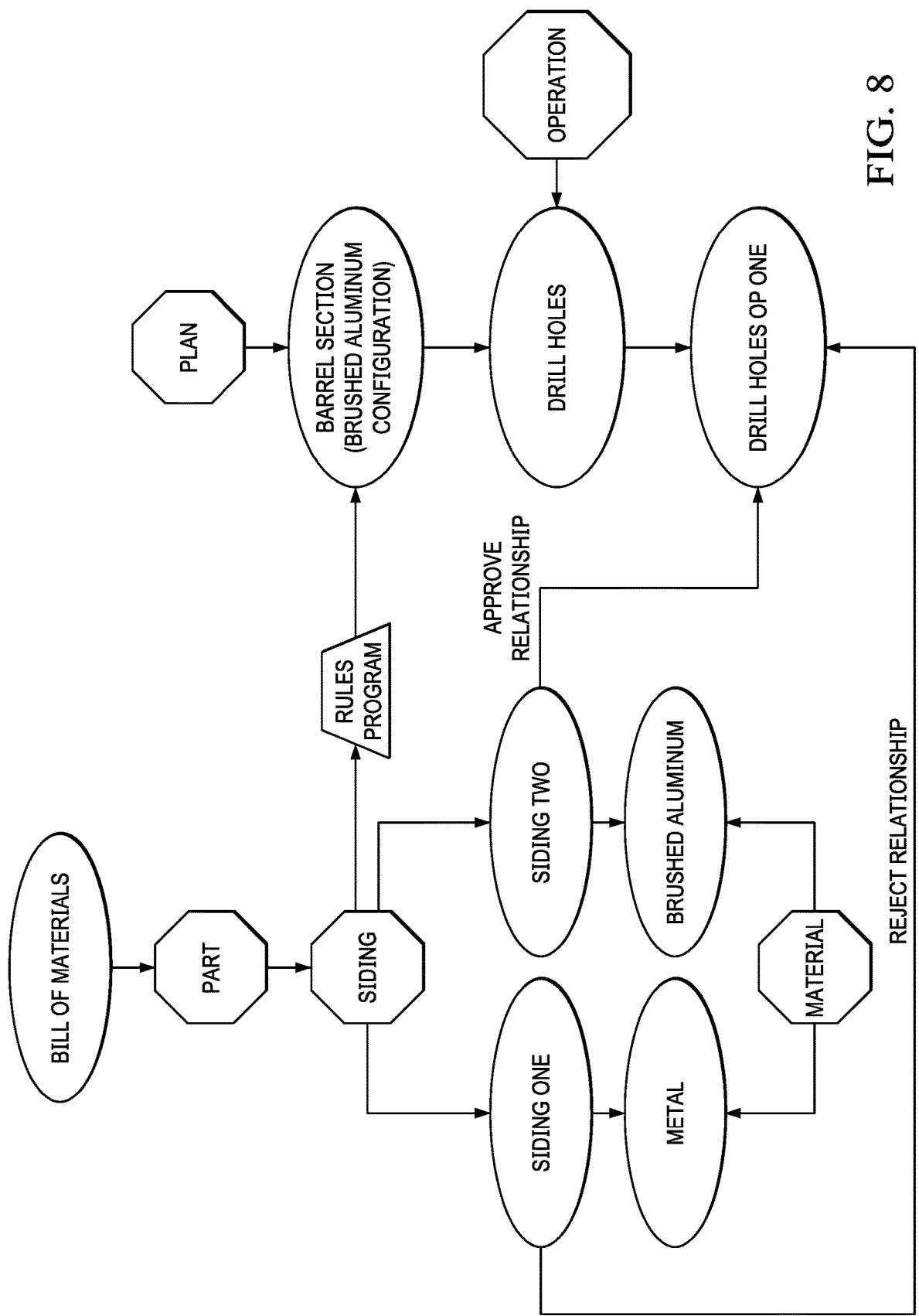
FIG. 8 is an illustration of a flowchart of an example of a context driven process flow for the change of build plan described with respect to FIG. 7, in accordance with an illustrative embodiment.

In turn, FIG. 8 illustrates an example of a context driven process flow for the change of build plan described with respect to FIG. 7, in accordance with an illustrative embodiment. The various shapes shown in FIG. 8 have similar properties and meanings as those shown in FIGS. 5A-5B and FIG. 6. Note the mappings of digital data objects to rules and abstract data objects used to update the overall build plan.

Figure 9:
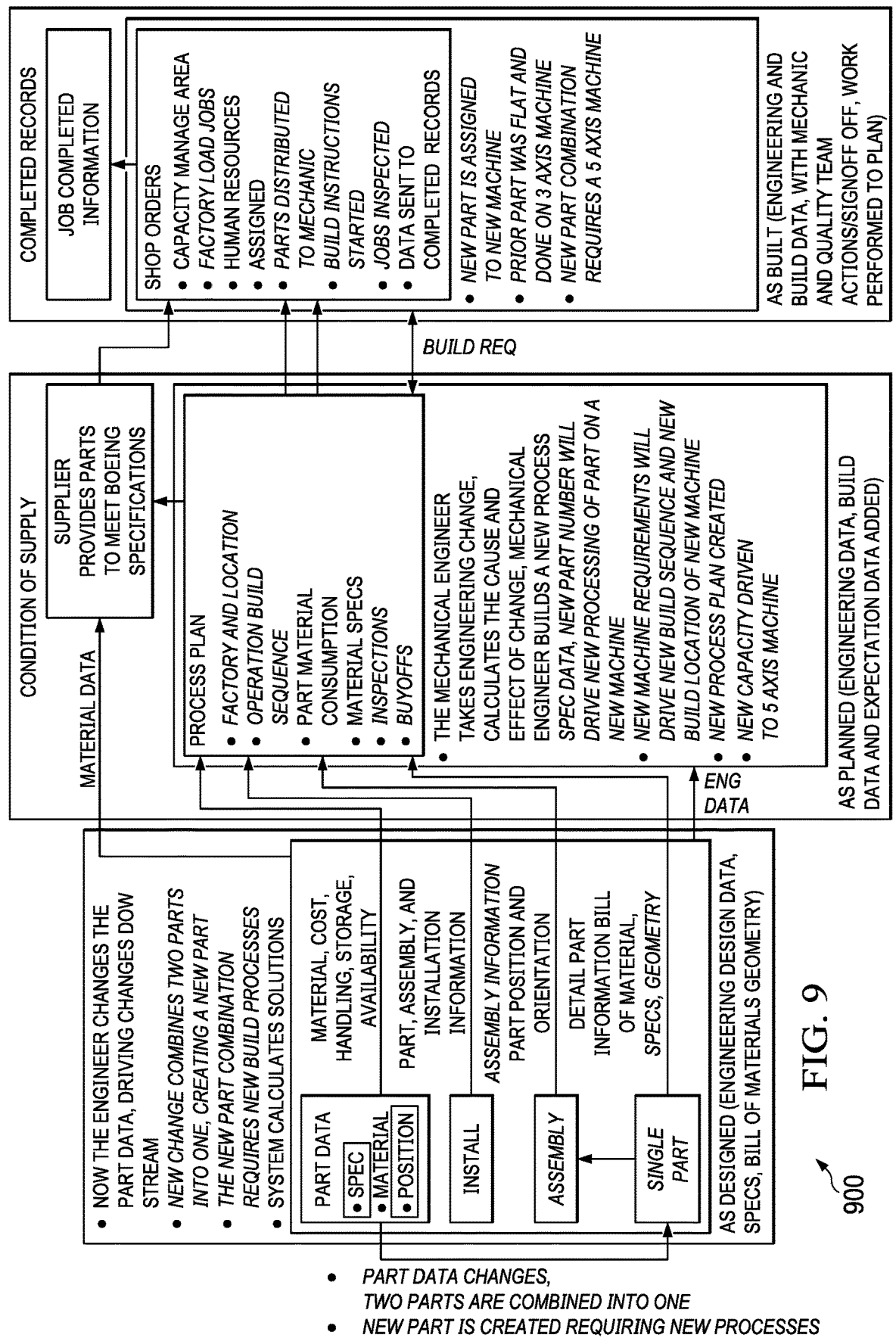
FIG. 9 is an illustration of a block diagram of yet another example of a process flow for yet another change of build plan, in accordance with an illustrative embodiment.

FIG. 9 illustrates yet another example of a process flow for yet another change of build plan, in accordance with an illustrative embodiment. Process flow 900 is a variation of the example shown in FIGS. 5A-5B and FIG. 6. However, in this illustrative embodiment, a change request is made to change the build plan by combining two parts into one, thereby creating a new part with new properties.

Figure 10:
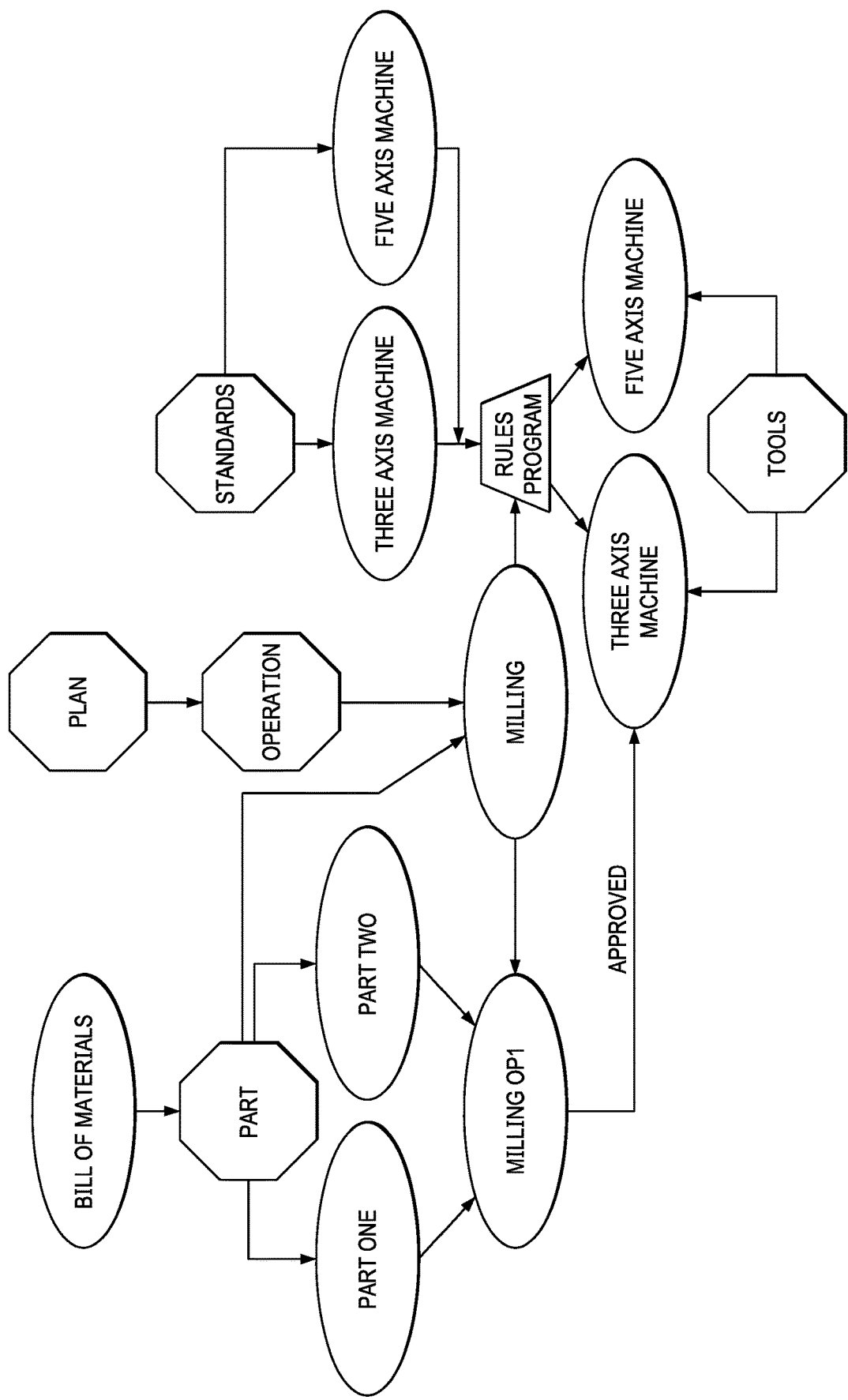
FIG. 10 is an illustration of a flowchart of an example of a context driven process flow for the change of build plan described with respect to FIG. 9, in accordance with an illustrative embodiment.

In turn, FIG. 10 illustrates an example of a context driven process flow for the change of build plan described with respect to FIG. 9, in accordance with an illustrative embodiment. In this example, the context driven process flow shows a description of parts having features formed on at least three sides by drilling and machining operations, such parts being milled requiring a three-axis machine due to constrains outlined in standards stored in the build plan data. Such a part may be assembled to another parts having features on additional sides. In this example, a change request may be received (via user input) for a particular digital data object associated with the design of the parts. For example, a production team may wish to have the above two parts integrated into one part, where the combined part would have features formed by drilling and machining on more than 3 sides. The computer and context driven process flow would assign a context criterion to the design digital data object associating a rule that parts with features formed by drilling and machining on more than 3 sides require use of a 6-axis milling machine. The computer and context driven process flow would establish a mapping between the design digital data object (for the parts) and production digital data objects (such as machining programs for multi-axis machines associated with the part), where the mapping is based on the rule requiring a 6-axis milling machine, and properties of a part with features on multiple sides associated with the particular design digital data object to which the requested change pertains. The mapping module is further configured to automatically send a digital change request to an authority associated with design digital data objects in a design database and production digital data objects in a production database, where the change request includes information based on the properties and rules and options for selection of 6-axis production equipment derived from the mapping. Upon approval by the appropriate authorities, the computer and context driven process will update the context-driven build plan with the digital change request to reflect a change to production-related information associated with the particular digital data object. The various shapes shown in FIG. 8 have similar properties and meanings as those shown in FIGS. 5A-5B and FIG. 6. Note the mappings of digital data objects to rules and abstract data objects used to update the overall build plan.

Figure 11:
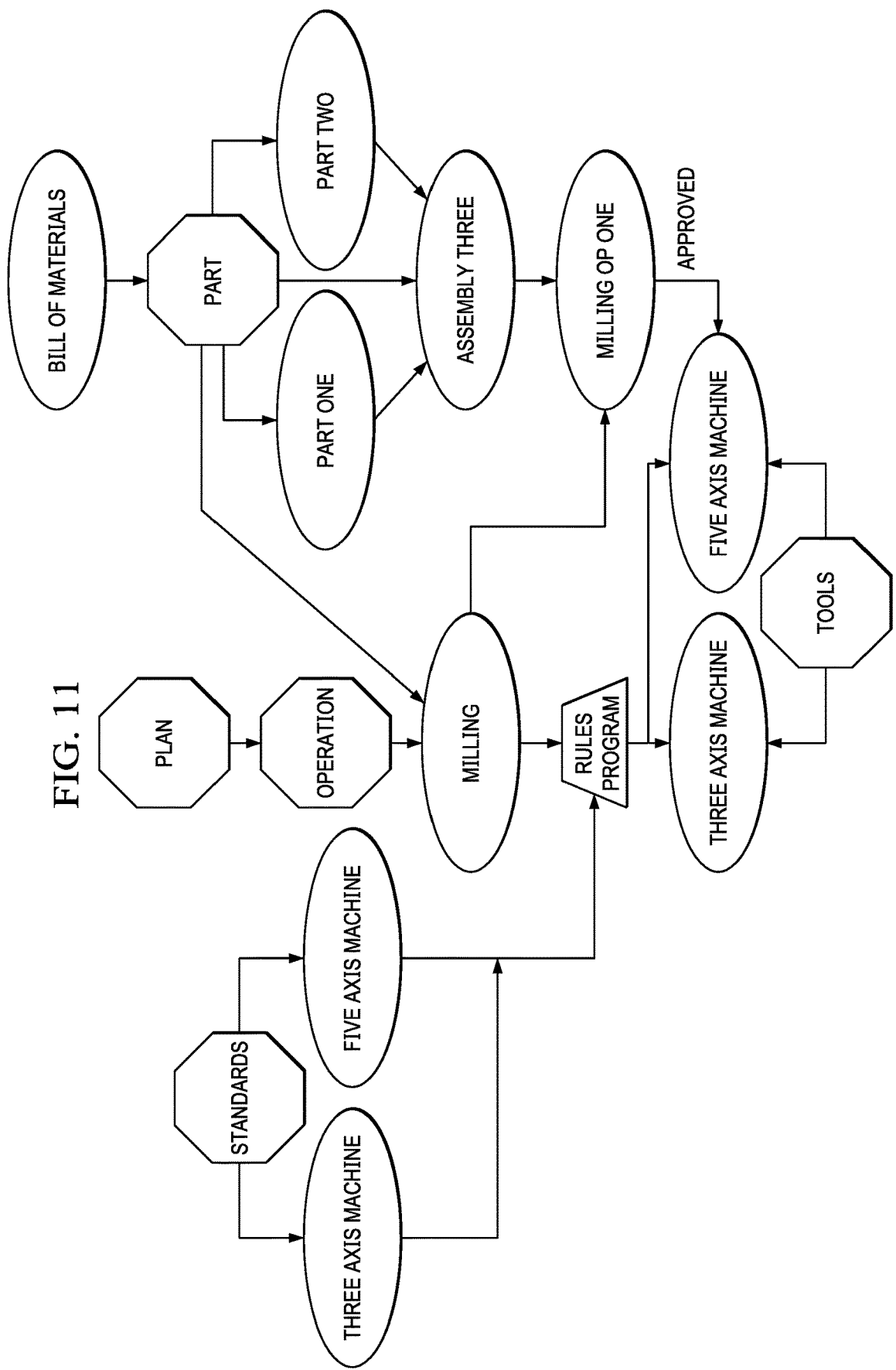
FIG. 11 is an illustration of a flowchart of another example of a context driven process flow for the change of build plan described with respect to FIG. 9, in accordance with an illustrative embodiment.

Likewise, FIG. 11 illustrates another example of a context driven process flow for the change of build plan described with respect to FIG. 9, in accordance with an illustrative embodiment. FIG. 11 is part of the example shown in FIG.

9 and FIG. 10. In particular, the context drive process flow shows parts combined into an assembly which requires a five-axis milling machine due to constraints outlined in the standards.

Taken together, FIG. 9 through FIG. 11 show a major advantage of the automated build plan Lifecyle of the illustrative embodiments. In particular, the illustrative embodiments take the change request to combine two products into a single product and map all of the underlying digital data objects to each other using rules in order to find possibly hidden requirements which can then be automatically provided in the resulting updated plan. In this example, each of the individual parts could be manufactured using a three-axis milling machine. However, after mapping the digital data objects using the rules programs, it is determined that the combined product is to be milled using a five-axis milling machine due to some constraints that may have not been previously considered.

This updated plan can then be presented to the change authority as well as to the original team requesting the change, as well as to the build team tasked with actually building the part. Accordingly, the coordination and efficiency of submitting, considering, and implementing the requested change is both automated and greatly improved relative to a similar manual change review process.

Figure 12:
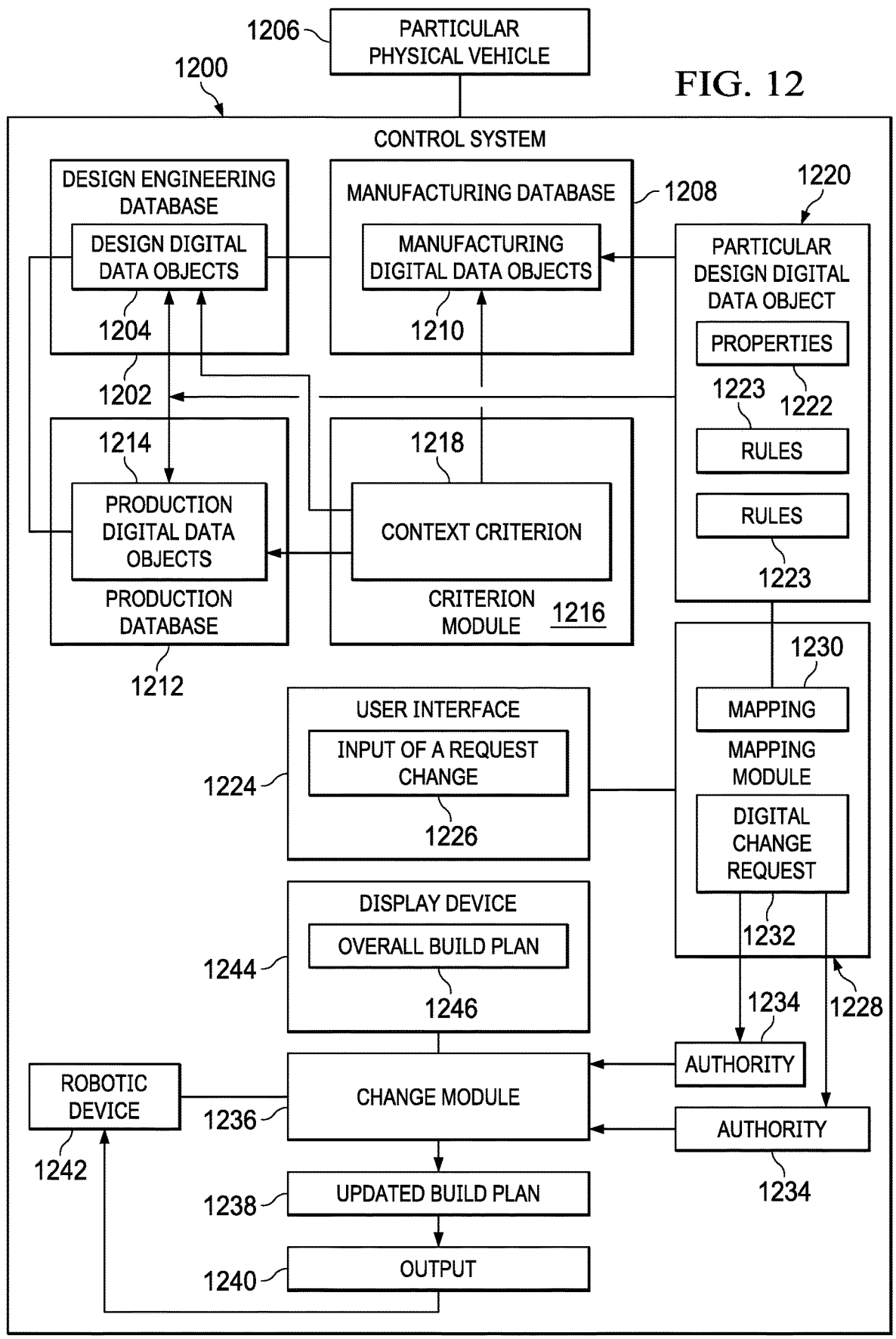
FIG. 12 is an illustration of a block diagram of a control system for updating a context-driven build plan for production of a physical vehicle, in accordance with an illustrative embodiment.

FIG. 12 illustrates a control system for updating a context-driven build plan for production of a physical vehicle, in accordance with an illustrative embodiment. FIG. 12 is a system which may be used to implement the illustrative embodiments described above with respect to FIG. 2 through FIG. 11 to manufacture a complex machine, such as aircraft 100 of FIG. 1.

Control system 1200 may be implemented as software executable on a computer, in combination with a graphical user interface displayed on a display device. The software may receive data and user input via one or more physical user input devices, and/or from other computers and systems in a distributed computing environment. Control system 1200 may also be implemented as a purely hardware device, such as via the use of application specific integration circuits, or as a combination of software and hardware.

Control system 1200 refers to various modules and databases. A module is typically implemented as a software engine or software module, but may be hardware as described above. A database is typically implemented as software combined with data, but may be hardware as described above. Note, however, that the various digital data objects are discrete data structures having different properties, rules, and metadata that convey an infrastructure that allows for the mapping of these various objects. Thus, the various digital data objects described with respect to FIG. 12 may be considered special-purpose data structures that provide an underlying structure which allows for the interoperability of the illustrative embodiments.

From the above, it will be appreciated that control system 1200 provides a technical effect in that control system 1200 allows a computer to do what previously it could not do; that is, automatically update a build plan lifecycle for a complex machine or other complex object, such as an aircraft. Thus, control system 1200 effectively improves the use and operation of a computer. Control system 1200 provides another technical effect in that it allows the presentation of data to a user in a manner that the user can more easily absorb the relevant portions of extremely complex and voluminous data. Thus, again, the illustrative embodiments solve a computer-centric problem and do not relate to manual processes or to thought experiments.

Control system 1200 may be characterized as a device for updating a context-driven build plan for production of a physical vehicle. Control system 1200 includes design engineering database 1202 having a plurality of design digital data objects 1204 associated with particular physical vehicle 1206.

Control system 1200 also includes manufacturing database 1208 having plurality of manufacturing digital data objects 1210 that include process-related information associated with the plurality of design digital data objects 1204.

Control system 1200 also includes production database 1212 having plurality of production digital data objects 1214 that include production information associated with the plurality of design digital data objects 1204.

Control system 1200 also includes criterion module 1216 configured to assign context criterion 1218 to any of the plurality of design digital data objects 1204, the plurality of manufacturing digital data objects 1210, or the plurality of production digital data objects 1214. Criterion module 1216 is further configured to assign context criterion 1218 to a particular design digital data object 1220 based on properties 1222 or rules 1223 associated with particular design digital data object 1220. Note that the term "properties or rules" also contemplates their conjunction, that is, the combination of "properties and rules".

Control system 1200 also includes user interface 1224 configured to receive an input of a requested change 1226 for the particular design digital data object 1220 associated with the physical vehicle 1206.

Control system 1200 also includes mapping module 1228 configured to establish mapping 1230 between particular design digital data object 1220 and any of the plurality of design digital data objects 1204, the plurality of manufacturing digital data objects 1210, or the plurality of production digital data objects 1214. Mapping module 1228 is configured to establish mapping 1230 based on properties 1222 or rules 1223 associated with particular design digital data object 1220 to which the requested change pertains. Mapping module 1228 is further configured to automatically send digital change request 1232 to authority 1234 associated with whichever of plurality of design digital data objects 1204, plurality of manufacturing digital data objects 1210, or plurality of production digital data objects 1214 to which the requested change for the particular digital design data object 1220 pertains. Automatic sending includes information based on the properties 1222 or rules 1223 associated with the particular design digital data object 1220 and also on information derived from mapping. Note that authority 1234 may be a computer program configured to evaluate and approve change requests, or in other illustrative embodiments may be a human. Authority 1234 may be a robotic device, the output of software, or any other person, device, or mechanism that can authorize a requested change. Authority 1234 may also be multiple humans, possibly from different organizations, and also may be groups of humans and/or robotic or computer processes.

Control system 1200 also includes change module 1236 configured, upon approval by authority 1234, to update the context-driven build plan with the digital change request 1232 to reflect a change to process-related information or production-related information associated with the particular design digital data object 1220, whereby updated build plan 1238 is generated.

The illustrative embodiments described above may be varied. For example, in an illustrative embodiment, change module 1236 is further configured to generate output 1240 of updated build plan 1238.

In another example, control system 1200 may also include robotic device 1242 that receives a command based on output 1240 to implement the change request during manufacturing of particular physical vehicle 1206. For example, the generated output 1240 of the updated build plan 1238 may generate a command or output of a Numerical Control program for operating a 6-axis milling machine to produce the part having features formed on multiple sides by drilling and machining operations, in response to approval of a change request associated with the part and updated build plan 1238. In still another illustrative embodiment, particular physical vehicle 1206 may be an aircraft 100. In this case, the aircraft 100 comprises more than one million parts. Each part interrelates with at least one other part such that a change to one part affects either another part or a manufacturing process of the aircraft 100.

In yet another illustrative embodiment, the requested change associated with particular design digital data object 1220 is a change to one of a manufacturing process for a part, an inventory location for the part, or a material used for the part. The digital change request 1232 sent to authority 1234 includes information derived from a rule associated with particular design digital data object 1204 that includes one of a part storage rule, a material property rule or a multi-axis machining rule.

In another example, control system 1200 may also include display device 1244 connected to change module 1236 and configured to display overall build plan 1246 at a process level and to display, highlighted, how updated build plan 1238 affects overall build plan 1246.

In still another example, display device 1244 is further configured to display a content of overall build plan 1246 with respect to the parts as a whole, and context parts added to each stage or iteration of overall build plan 1246.

In yet another example, the requested change is to change a manufacturing process, an inventory location or a material used for a part. In this case, control system 1200 automatically sends a request for approval to both a first authority responsible for a part and also a second authority responsible for manufacturing and storing the part. Sending the request for approval to the second authority is derived from mapping 1230 and at least one rule associated with the particular design digital data object 1220. In this manner, control system 1200 automatically accounts for a user being unaware that input from the second authority is needed for the change request.

In another illustrative embodiment, control system 1200 is further configured to transmit updated machining instructions to machine the part based on the change to the material of the part. In still another illustrative embodiment, design engineering database 1202, manufacturing database 1208, and production database 1212 are maintained and used separately from each other in separate physical computers that are networked with each other.

Figure 13A:
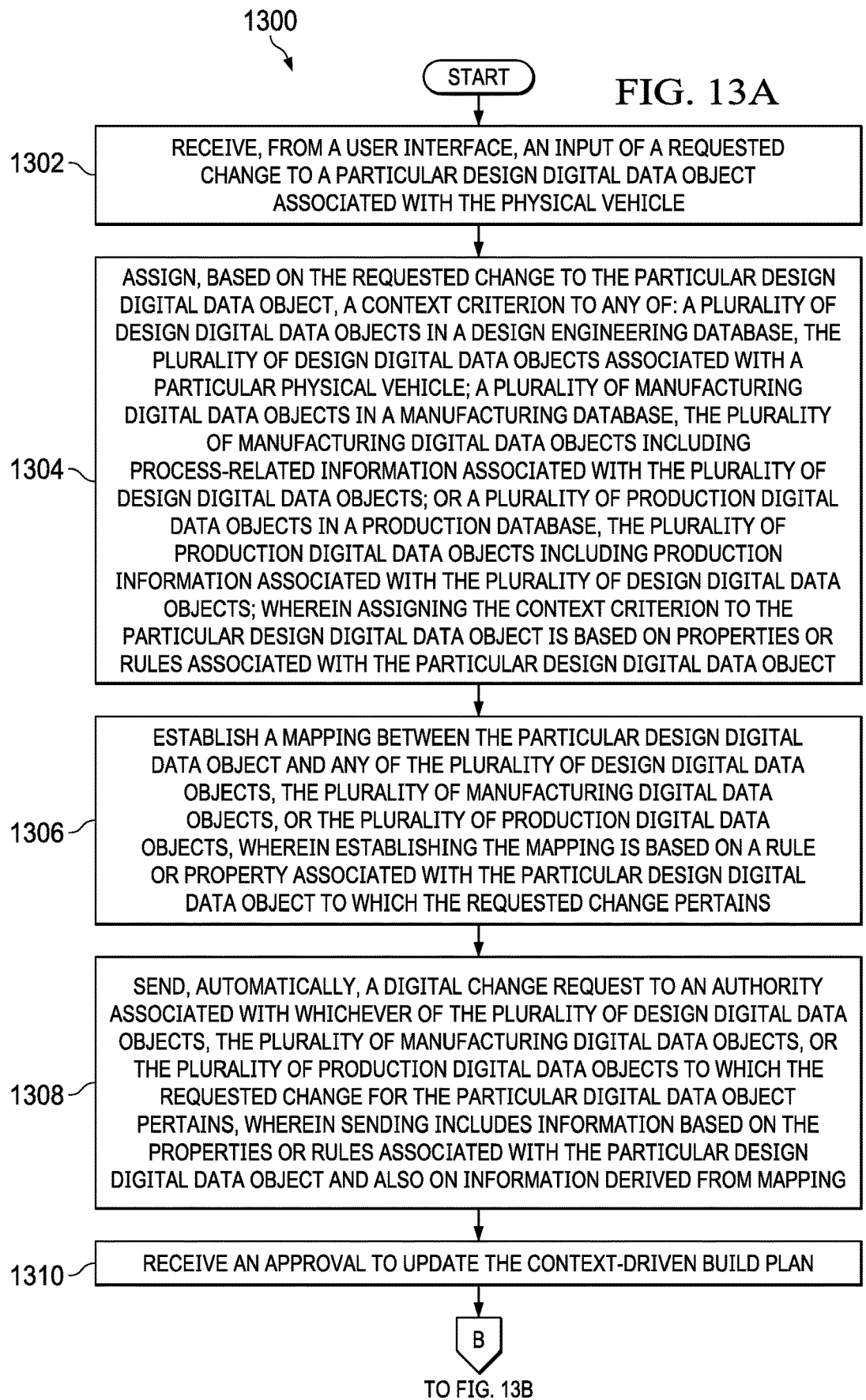
FIGS. 13A-13B are an illustration of block diagrams of a method for updating a context-driven build plan for production of a physical vehicle, in accordance with an illustrative embodiment.
Figure 13B:
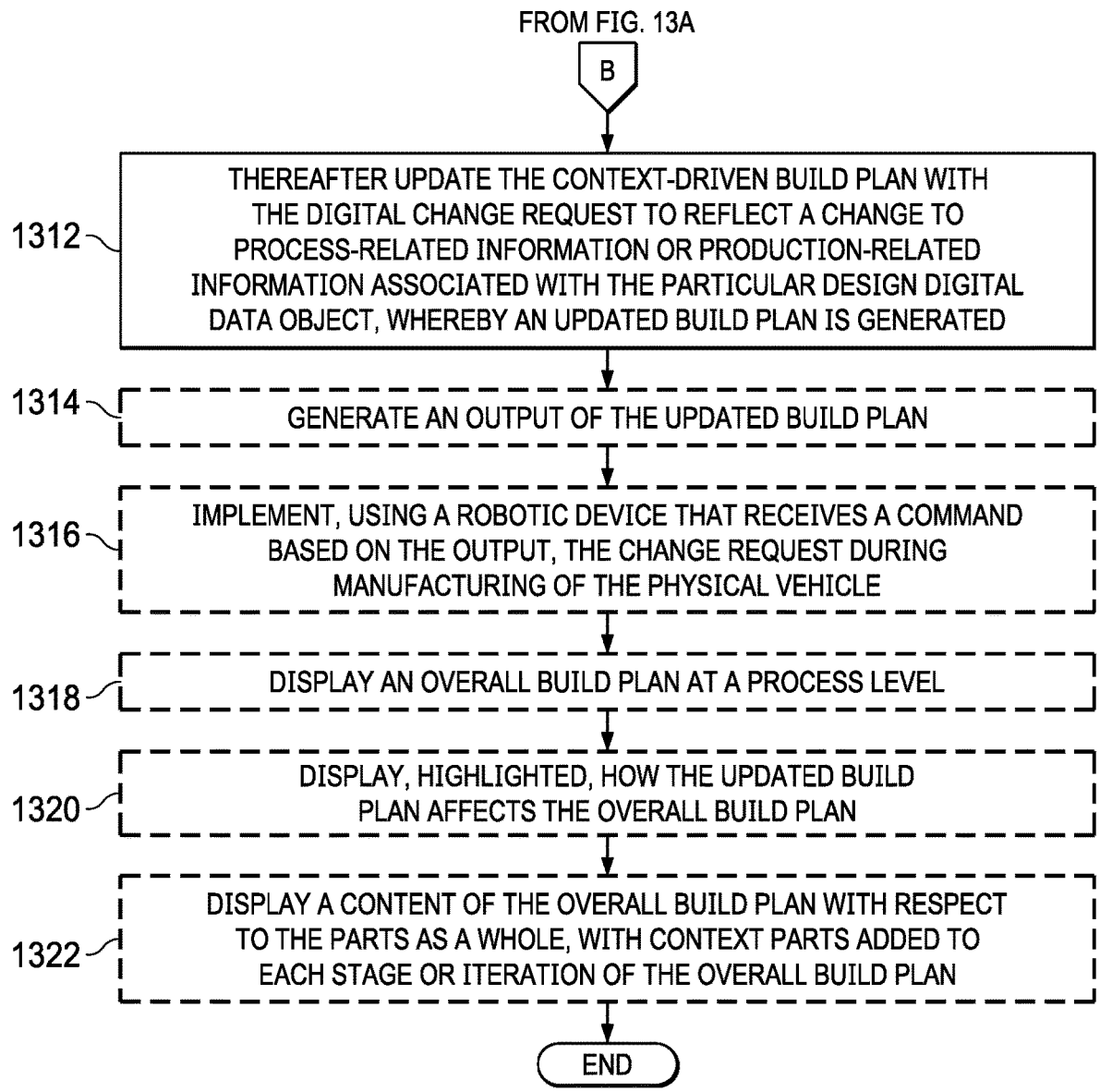

FIG. 13 illustrates a method for updating a context-driven build plan for production of a physical vehicle, in accordance with an illustrative embodiment. Method 1300 is a variation of the methods described above with respect to FIG. 2 through FIG. 11. Method 1300 may be implemented by control system 1200 of FIG. 12. Optional operations in method 1300 are shown with dashed boxes. Method 1300 may be characterized as a method for updating a context-driven build plan for production of a physical vehicle 1206. Method 1300 includes receiving, from a user interface, an input of a requested change to a particular design digital data object associated with the physical vehicle (operation 1302).

Method 1300 also includes assigning, based on the requested change to the particular design digital data object, a context criterion to any of: a plurality of design digital data objects in a design engineering database, the plurality of design digital data objects associated with a particular physical vehicle; a plurality of manufacturing digital data objects in a manufacturing database, the plurality of manufacturing digital data objects including process-related information associated with the plurality of design digital data objects; or a plurality of production digital data objects in a production database, the plurality of production digital data objects including production information associated with the plurality of design digital data objects; wherein assigning the context criterion to the particular design digital data object is based on properties or rules associated with the particular design digital data object (operation 1304).

Method 1300 also includes establish a mapping between the particular design digital data object and any of the plurality of design digital data objects, the plurality of manufacturing digital data objects, or the plurality of production digital data objects, wherein establishing the mapping is based on a rule or property associated with the particular design digital data object to which the requested change pertains (operation 1306).

Method 1300 also includes sending, automatically, a digital change request to an authority associated with whichever of the plurality of design digital data objects, the plurality of manufacturing digital data objects, or the plurality of production digital data objects to which the requested change for the particular digital data object pertains, wherein sending includes information based on the properties or rules associated with the particular design digital data object and also on information derived from mapping (operation 1308). Method 1300 also includes receiving an approval to update the context-driven build plan (operation 1310). Method 1300 also includes, thereafter updating the context-driven build plan with the digital change request to reflect a change to process-related information or production-related information associated with the particular design digital data object, whereby an updated build plan is generated (operation 1312). In one illustrative embodiment, the method may terminate thereafter.

Method 1300 may be varied. For example, method 1300 may also include generating an output of the updated build plan (operation 1314). In this case, method 1300 may also include implementing, using a robotic device that receives a command based on the output, the change request during manufacturing of the physical vehicle (operation 1316). In one illustrative embodiment, the method may terminate thereafter.

In another illustrative embodiment, receiving the requested change associated with the particular design digital data object comprises receiving a requested change to one of a manufacturing process for a part, an inventory location for the part, or a material used for the part, and sending the digital change request includes sending to the authority information derived from a rule associated with the particular design digital data object that includes one of a part storage rule, a material property rule or a multi-axis machining rule.

In yet another illustrative embodiment, method 1300 may also include displaying an overall build plan at a process level (operation 1318). Note that the output at operation 1318 is not limited at a process level. The output at this operation could be at a digital data object level, for example, to output a current inventory of a consumable part. As part of displaying the overall build plan, method 1300 may also include displaying, highlighted, how the updated build plan affects the overall build plan (operation 1320). In one illustrative embodiment, the method may terminate thereafter.

Method 1300 may also include displaying a content of the overall build plan with respect to the parts as a whole, with context parts added to each stage or iteration of the overall build plan (operation 1322). In one illustrative embodiment, the method may terminate thereafter.

In still another illustrative embodiment, the requested change is to change a manufacturing process, an inventory location or a material used for a part, and sending comprises sending a request approval to both a first authority responsible for a part and also a second authority responsible for manufacturing and storing the part. Sending the request for approval to the second authority is derived from the mapping and at least one rule associated with the particular design digital data object. In this manner, method 1300 automatically accounts for a user being unaware that input from the second authority is needed for the change request.

In yet another illustrative embodiment, method 1300 may also include transmitting updated machining instructions to a machine to machine the part based on the change to the material of the part. Still other variations are possible. Thus, the illustrative embodiments described with respect to method 1300 do not necessarily limit the claimed inventions or the other illustrative embodiments described herein.

FIG. 14 illustrates a method for more efficiently manufacturing a physical vehicle by using an updating a context-driven build plan for production of the physical vehicle, in accordance with an illustrative embodiment. Method 1400 is a variation of the methods described above with respect to FIG. 2 through FIG. 11 and FIG. 13. Method 1400 may be implemented by control system 1200 of FIG. 12. Method 1400 may be characterized as a method for more efficiently manufacturing a physical vehicle by using an updating a context-driven build plan for production of the physical vehicle.

Method 1400 includes receiving, from a user interface, an input of a requested change to a particular design digital data object associated with the physical vehicle (operation 1402). Method 1400 also includes assigning, based on the requested change to the particular design digital data object, a context criterion to any of: a plurality of design digital data objects in a design engineering database, the plurality of design digital data objects associated with a particular physical vehicle; a plurality of manufacturing digital data objects in a manufacturing database, the plurality of manufacturing digital data objects including process-related information associated with the plurality of design digital data objects; or a plurality of production digital data objects in a production database, the plurality of production digital data objects including production information associated with the plurality of design digital data objects, wherein assigning the context criterion to the particular design digital data object is based on properties or rules associated with the design digital data object (operation 1404).

Method 1400 also includes establish a mapping between the particular design digital data object and any of the plurality of design digital data objects, the plurality of manufacturing digital data objects, or the plurality of production digital data objects, wherein establishing the mapping is based on a rule or property associated with the particular design digital data object to which the requested change pertains (operation 1406). method 1400 also includes sending, automatically, a digital change request to an authority associated with whichever of the plurality of design digital data objects, the plurality of manufacturing digital data objects, or the plurality of production digital data objects to which the requested change for the particular digital data object pertains, wherein sending includes information based on the properties or rules associated with the particular design digital data object and also on information derived from mapping (operation 1408).

Method 1400 also includes receiving an approval to update the context-driven build plan (operation 1410). Method 1400 also includes, thereafter, updating the context-driven build plan with the digital change request to reflect a change to process-related information or production-related information associated with the particular design digital data object, whereby an updated build plan is generated (operation 1412). Method 1400 also includes modifying manufacturing of the physical vehicle based on the updated build plan (operation 1414). In one illustrative embodiment, the method may terminate thereafter.

Still other variations are possible. Thus, the illustrative embodiments described with respect to method 1300 do not necessarily limit the claimed inventions or the other illustrative embodiments described herein.

Figure 15:
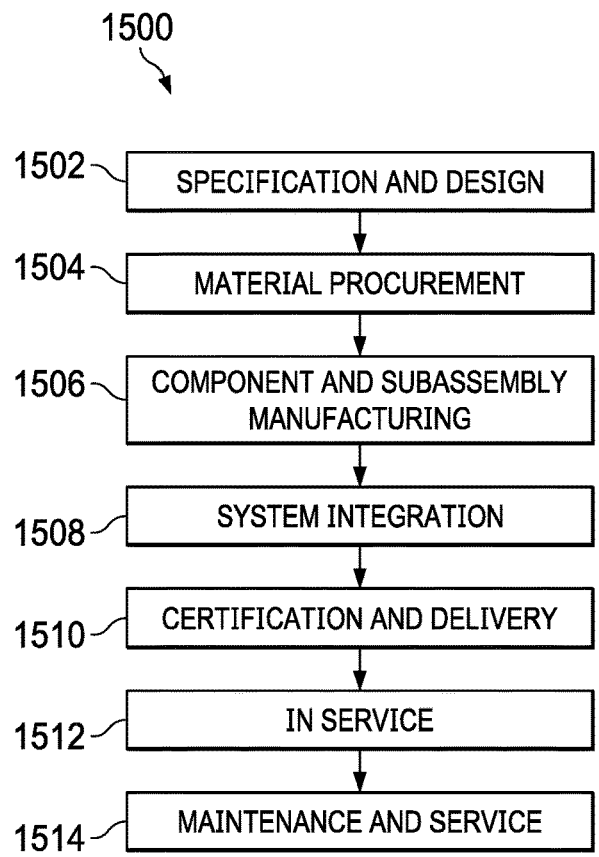
FIG. 15 is an illustration of a block diagram of an aircraft manufacturing and service method in accordance with an illustrative embodiment.
Figure 16:
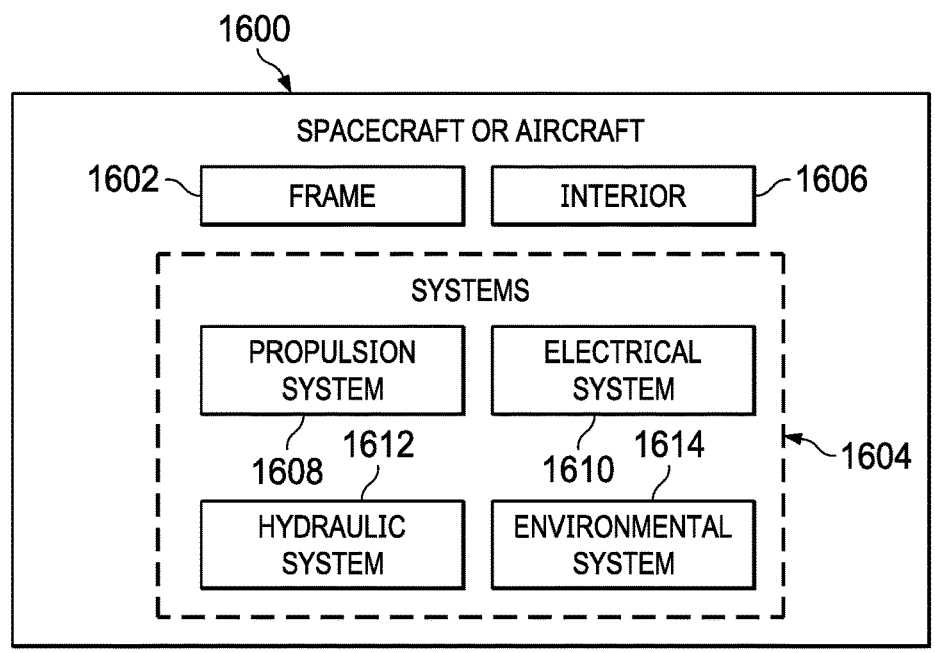
FIG. 16 is an illustration of a block diagram of an aircraft in which an illustrative embodiment may be implemented.

Illustrative embodiments of the disclosure may be described in the context of aircraft manufacturing and service method 1500 as shown in FIG. 15 and aircraft 1600 as shown in FIG. 16. Aircraft 1600 may be aircraft 100 of FIG. 1. The techniques described herein may be used to manufacture aircraft 1600 using aircraft manufacturing and service method 1500. The techniques described with respect to FIG. 15 and FIG. 16 may take advantage of the automated context driven build plan devices and methods described with respect to FIG. 2 through FIG. 14.

Turning first to FIG. 15, an illustration of an aircraft manufacturing and service method is depicted in accordance with an illustrative embodiment. During pre-production, aircraft manufacturing and service method 1500 may include specification and design 1502 of aircraft 1600 in FIG. 16 and material procurement 1504.

During production, component and subassembly manufacturing 1506 and system integration 1508 of aircraft 1600 in FIG. 16 takes place. Thereafter, aircraft 1600 in FIG. 16 may go through certification and delivery 1510 in order to be placed in service 1512. While in service 1512 by a customer, aircraft 1600 in FIG. 16 is scheduled for routine maintenance and service 1514, which may include modification, reconfiguration, refurbishment, and other maintenance or service.

The automated context driven build plan systems and methods described with respect to FIG. 2 through FIG. 14 may be applied with respect to service method 1500 and aircraft 1600. For example, the illustrative embodiments described above may be applied, for example, on at least component and subassembly manufacturing 1506, system integration 1508, maintenance and service 1514, to build airframe 1602, and interior 1606, in order to create spacecraft or aircraft 1600.

Each of the processes of aircraft manufacturing and service method 1500 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 16, an illustration of an aircraft is depicted in which an illustrative embodiment may be implemented. In this example, aircraft 1600 is produced by aircraft manufacturing and service method 1500 in FIG. 15 and may include airframe 1602 with plurality of systems 1604 and interior 1606. Examples of systems 1604 include one or more of propulsion system 1608, electrical system 1610, hydraulic system 1612, and environmental system 1614. Any number of other systems 1604 may be included. Although an aerospace example is shown, different illustrative embodiments may be applied to other industries, such as the automotive industry.

Apparatuses and methods embodied herein may be employed during at least one of the stages of aircraft manufacturing and service method 1500 in FIG. 15.

In one illustrative example, components or subassemblies produced in component and subassembly manufacturing 1506 in FIG. 15 may be fabricated or manufactured in a manner similar to components or subassemblies produced while aircraft 1600 is in service 1512 in FIG. 15. As yet another example, one or more apparatus embodiments, method embodiments, or a combination thereof may be utilized during production stages, such as component and subassembly manufacturing 1506 and system integration 1508 in FIG. 15. One or more apparatus embodiments, method embodiments, or a combination thereof may be utilized while aircraft 1600 is in service 1512 and/or during maintenance and service 1514 in FIG. 15. The use of a number of the different illustrative embodiments may substantially expedite the assembly of and/or reduce the cost of aircraft 1600.

Figure 17:
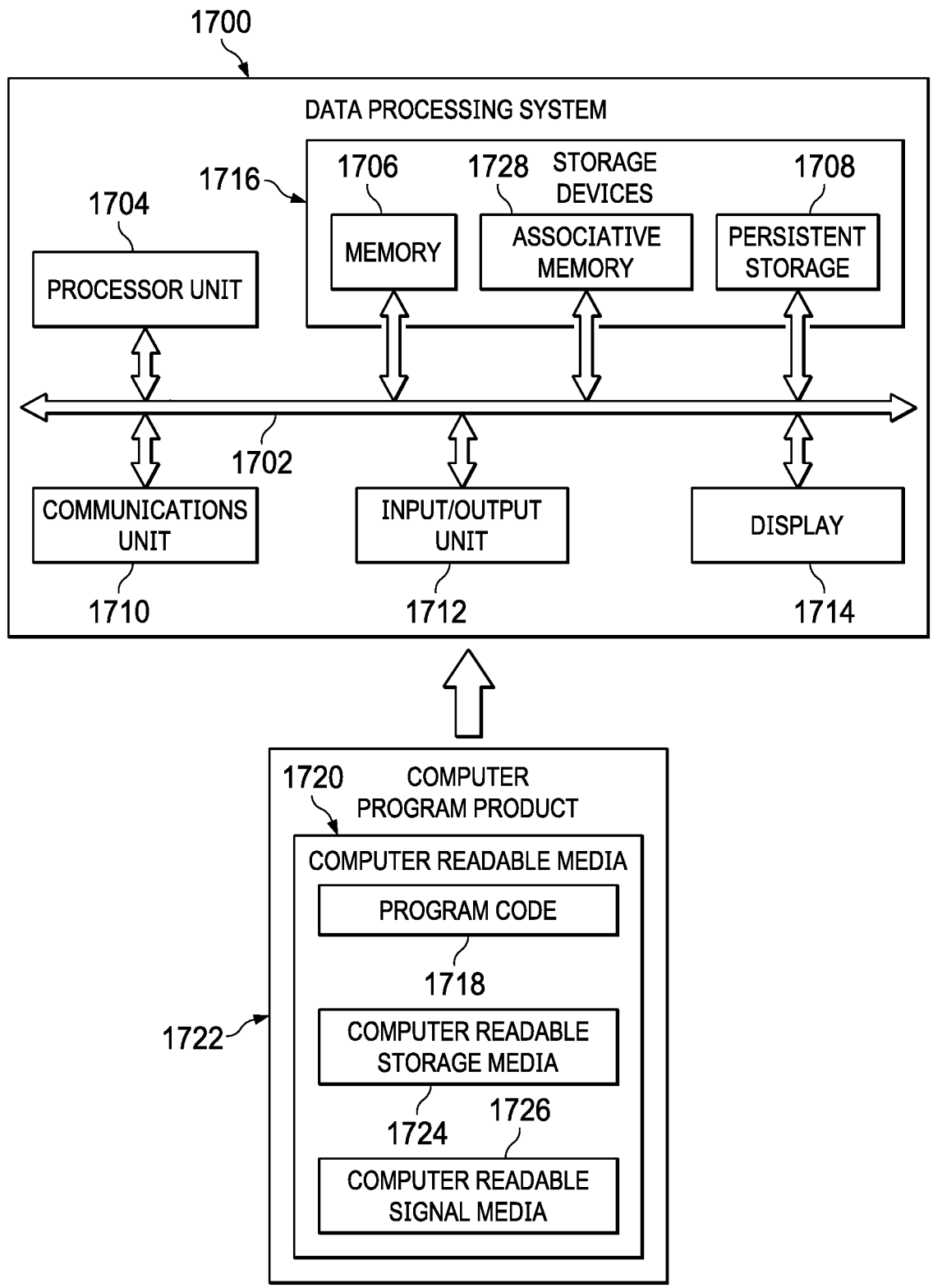
FIG. 17 is an illustration of a block diagram of a data processing system in accordance with an illustrative embodiment.

Turning now to FIG. 17, an illustration of a data processing system 1700 is depicted in accordance with an illustrative embodiment. Data processing system 1700 in FIG. 17 is an example of a data processing system 1700 that may be used to implement the illustrative embodiments, such those described with respect to FIG. 2 through FIG. 14. In this illustrative example, data processing system 1700 includes communications fabric 1702, which provides communications between processor unit 1704, memory 1706, persistent storage 1708, communications unit 1710, input/output (I/O) unit 1712, and display 1714.

Processor unit 1704 serves to execute instructions for software that may be loaded into memory 1706. This software may be an associative memory, content addressable memory, or software for implementing the processes described elsewhere herein. Thus, for example, software loaded into memory 1706 may be software for executing the methods described with respect to FIG. 2 through FIG. 14. Processor unit 1704 may be a number of processors, a multi-processor core, or some other type of processor, depending on the particular implementation. A number, as used herein with reference to an item, means one or more items. Further, processor unit 1704 may be implemented using a number of heterogeneous processor systems in which a main processor is present with secondary processors on a single chip. As another illustrative example, processor unit 1704 may be a symmetric multi-processor system containing multiple processors of the same type.

Memory 1706 and persistent storage 1708 are examples of storage devices 1716. A storage device is any piece of hardware that is capable of storing information, such as, for example, without limitation, data, program code in functional form, and/or other suitable information either on a temporary basis and/or a permanent basis. Storage devices 1716 may also be referred to as computer readable storage devices in these examples. Memory 1706, in these examples, may be, for example, a random access memory or any other suitable volatile or non-volatile storage device. Persistent storage 1708 may take various forms, depending on the particular implementation.

For example, persistent storage 1708 may contain one or more components or devices. For example, persistent storage 1708 may be a hard drive, a flash memory, a rewritable optical disk, a rewritable magnetic tape, or some combination of the above. The media used by persistent storage 1708 also may be removable. For example, a removable hard drive may be used for persistent storage 1708.

Communications unit 1710, in these examples, provides for communications with other data processing systems or devices. In these examples, communications unit 1710 is a network interface card. Communications unit 1710 may provide communications through the use of either or both physical and wireless communications links.

Input/output (I/O) unit 1712 allows for input and output of data with other devices that may be connected to data processing system 1700. For example, input/output (I/O) unit 1712 may provide a connection for user input through a keyboard, a mouse, and/or some other suitable input device. Further, input/output (I/O) unit 1712 may send output to a printer. Display 1714 provides a mechanism to display information to a user.

Instructions for the operating system, applications, and/or programs may be located in storage devices 1716, which are in communication with processor unit 1704 through communications fabric 1702. In these illustrative examples, the instructions are in a functional form on persistent storage 1708. These instructions may be loaded into memory 1706 for execution by processor unit 1704. The processes of the different embodiments may be performed by processor unit 1704 using computer implemented instructions, which may be located in a memory, such as memory 1706.

These instructions are referred to as program code, computer usable program code, or computer readable program code that may be read and executed by a processor in processor unit 1704. The program code in the different embodiments may be embodied on different physical or computer readable storage media, such as memory 1706 or persistent storage 1708.

Program code 1718 is located in a functional form on computer readable media 1720 that is selectively removable and may be loaded onto or transferred to data processing system 1700 for execution by processor unit 1704. Program code 1718 and computer readable media 1720 form computer program product 1722 in these examples. In one example, computer readable media 1720 may be computer readable storage media 1724 or computer readable signal media 1726. Computer readable storage media 1724 may include, for example, an optical or magnetic disk that is inserted or placed into a drive or other device that is part of persistent storage 1708 for transfer onto a storage device, such as a hard drive, that is part of persistent storage 1708. Computer readable storage media 1724 also may take the form of a persistent storage, such as a hard drive, a thumb drive, or a flash memory, that is connected to data processing system 1700. In some instances, computer readable storage media 1724 may not be removable from data processing system 1700.

Alternatively, program code 1718 may be transferred to data processing system 1700 using computer readable signal media 1726. Computer readable signal media 1726 may be, for example, a propagated data signal containing program code 1718. For example, computer readable signal media 1726 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 1718 may be downloaded over a network to persistent storage 1708 from another device or data processing system through computer readable signal media 1726 for use within data processing system 1700. For instance, program code stored in a computer readable storage medium in a server data processing system may be downloaded over a network from the server to data processing system 1700. The data processing system 1700 providing program code 1718 may be a server computer, a client computer, or some other device capable of storing and transmitting program code 1718.

The different components illustrated for data processing system 1700 are not meant to provide architectural limitations to the manner in which different embodiments may be implemented. The different illustrative embodiments may be implemented in a data processing system 1700 including components in addition to or in place of those illustrated for data processing system 1700. Other components shown in FIG. 17 can be varied from the illustrative examples shown. The different embodiments may be implemented using any hardware device or system capable of running program code. As one example, the data processing system 1700 may include organic components integrated with inorganic components and/or may be comprised entirely of organic components excluding a human being. For example, a storage device may be comprised of an organic semiconductor.

In another illustrative example, processor unit 1704 may take the form of a hardware unit that has circuits that are manufactured or configured for a particular use. This type of hardware may perform operations without needing program code to be loaded into a memory from a storage device to be configured to perform the operations.

For example, when processor unit 1704 takes the form of a hardware unit, processor unit 1704 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, programmable array logic, a field programmable logic array, a field programmable gate array, and other suitable hardware devices. With this type of implementation, program code 1718 may be omitted because the processes for the different embodiments are implemented in a hardware unit.

In still another illustrative example, processor unit 1704 may be implemented using a combination of processors found in computers and hardware units. Processor unit 1704 may have a number of hardware units and a number of processors that are configured to run program code 1718. With this depicted example, some of the processes may be implemented in the number of hardware units, while other processes may be implemented in the number of processors.

As another example, a storage device in data processing system 1700 is any hardware apparatus that may store data. Memory 1706, persistent storage 1708, and computer readable media 1720 are examples of storage devices in a tangible form.

In another example, a bus system may be used to implement communications fabric 1702 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 1706, or a cache, such as found in an interface and memory controller hub that may be present in communications fabric 1702.

Data processing system 1700 may also include associative memory 1728. Associative memory 1728 may be in communication with communications fabric 1702. Associative memory 1728 may also be in communication with, or in some illustrative embodiments, be considered part of storage devices 1716. While one associative memory 1728 is shown, additional associative memories may be present.

As used herein, the term "associative memory" refers to a content addressable memory. An associative memory may also be described as a plurality of data and a plurality of associations among the plurality of data. The plurality of data and the plurality of associations may be stored in a non-transitory computer readable storage medium. The plurality of data may be collected into associated groups. The associative memory may be configured to be queried based on at least indirect relationships among the plurality of data in addition to direct correlations among the plurality of data. Thus, an associative memory may be configured to be queried based solely on direct relationships, based solely on at least indirect relationships, as well as based on combinations of direct and at least indirect relationships. An associative memory may be a content addressable memory.

Thus, an associative memory may be characterized as a plurality of data and a plurality of associations among the plurality of data. The plurality of data may be collected into associated groups. Further, the associative memory may be configured to be queried based on at least one relationship, selected from a group that includes direct and at least indirect relationships, or from among the plurality of data in addition to direct correlations among the plurality of data. An associative memory may also take the form of software. Thus, an associative memory also may be considered a process by which information is collected into associated groups in the interest of gaining new insight based on relationships rather than direct correlation. An associative memory may also take the form of hardware, such as specialized processors or a field programmable gate array.

As used herein, the term "entity" refers to an object that has a distinct, separate existence, though such existence need not be a material existence. Thus, abstractions and legal constructs may be regarded as entities. As used herein, an entity need not be animate. Associative memories work with entities.

The different illustrative embodiments can take the form of an entirely hardware embodiment, an entirely software embodiment, or an embodiment containing both hardware and software elements. Some embodiments are implemented in software, which includes but is not limited to forms such as, for example, firmware, resident software, and microcode.

Furthermore, the different embodiments can take the form of a computer program product accessible from a computer usable or computer readable medium providing program code for use by or in connection with a computer or any device or system that executes instructions. For the purposes of this disclosure, a computer usable or computer readable medium can generally be any tangible apparatus that can contain, store, communicate, propagate, or transport the program for use by or in connection with the instruction execution system, apparatus, or device.

The computer usable or computer readable medium can be, for example, without limitation an electronic, magnetic, optical, electromagnetic, infrared, or semiconductor system, or a propagation medium. Non-limiting examples of a computer readable medium include a semiconductor or solid state memory, magnetic tape, a removable computer diskette, a random access memory (RAM), a read-only memory (ROM), a rigid magnetic disk, and an optical disk. Optical disks may include compact disk—read only memory (CD-ROM), compact disk—read/write (CD-R/W), and DVD.

Further, a computer usable or computer readable medium may contain or store a computer readable or computer usable program code 1718 such that when the computer readable or computer usable program code 1718 is executed on a computer, the execution of this computer readable or computer usable program code causes the computer to transmit another computer readable or computer usable program code over a communications link. This communications link may use a medium that is, for example without limitation, physical or wireless.

A data processing system 1700 suitable for storing and/or executing computer readable or computer usable program code will include one or more processors coupled directly or indirectly to memory elements through a communications fabric 1702, such as a system bus. The memory elements may include local memory employed during actual execution of the program code 1718, bulk storage, and cache memories which provide temporary storage of at least some computer readable or computer usable program code to reduce the number of times code may be retrieved from bulk storage during execution of the code.

Input/output or I/O devices can be coupled to the system either directly or through intervening I/O controllers. These devices may include, for example, without limitation, keyboards, touch screen displays, and pointing devices. Different communications adapters may also be coupled to the system to enable the data processing system to become coupled to other data processing systems or remote printers or storage devices through intervening private or public networks. Non-limiting examples of modems and network adapters are just a few of the currently available types of communications adapters.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A control system for updating a context-driven build plan for production of a physical vehicle, the control system comprising:
   a design engineering database having a plurality of design digital data objects associated with a particular physical vehicle;
   a manufacturing database having a plurality of manufacturing digital data objects that include process-related information associated with the plurality of design digital data objects;
   a production database having a plurality of production digital data objects that include production information associated with the plurality of design digital data objects;
   a criterion module comprising a data processing system configured to assign a context criterion to any of the plurality of design digital data objects, the plurality of manufacturing digital data objects, or the plurality of production digital data objects, wherein the criterion module is further configured to assign the context criterion to a particular design digital data object based on properties or rules associated with the particular design digital data object;
   a user interface comprising the data processing system configured to receive an input of a requested change for the particular design digital data object associated with the physical vehicle;
   a mapping module comprising the data processing system configured to, in response to receiving the input of the requested change, use the assigned context criterion to establish a mapping between the particular design digital data object and any other of the plurality of design digital data objects, the plurality of manufacturing digital data objects, or the plurality of production digital data objects, wherein the mapping module is configured to establish the mapping based on the properties or rules associated with the particular design digital data object to which the requested change pertains, and wherein the mapping module is further configured to automatically send a digital change request to an authority associated with whichever of the plurality of design digital data objects, the plurality of manufacturing digital data objects, or the plurality of production digital data objects to which the requested change for the particular digital data object pertains, wherein the digital change request includes information based on the properties or rules associated with the particular design digital data object and also on information derived from the mapping; and
   a change module comprising the data processing system configured, upon approval by the authority, to update the context-driven build plan with the digital change request to reflect a change to process-related information or production-related information associated with the particular digital data object, whereby an updated build plan is generated.

2. The control system of claim 1 wherein the change module is further configured to generate an output of the updated build plan.

3. The control system of claim 2 further comprising:
   a robotic device that receives a command based on the output to implement the change request during manufacturing of the physical vehicle.

4. The control system of claim 1 wherein the physical vehicle comprises an aircraft.

5. The control system of claim 4 wherein the aircraft comprises more than one million parts, wherein each part interrelates with at least one other part such that a change to one part affects either another part or a manufacturing process of the aircraft.

6. The control system of claim 1 wherein the requested change associated with the particular design digital data object is a change to one of a manufacturing process for a part, an inventory location for the part, or a material used for the part, and the digital change request sent to the authority includes information derived from a rule associated with the particular design digital data object that includes one of a part storage rule, a material property rule or a multi-axis machining rule.

7. The control system of claim 1 further comprising:
a display device connected to the change module and configured to display an overall build plan at a process level and to display, highlighted, how the updated build plan affects the overall build plan.

8. The control system of claim 7 wherein the display device is further configured to display a content of the overall build plan with respect to the parts as a whole, and context parts added to each stage or iteration of the overall build plan.

9. The control system of claim 1 wherein the requested change is to change a manufacturing process, an inventory location or a material used for a part, and wherein the control system automatically sends a request approval to both a first authority responsible for a part and also a second authority responsible for manufacturing and storing the part, wherein sending the request for approval to the second authority is derived from the mapping and the properties or rules associated with the particular design digital data object.

10. The control system of claim 9 wherein the control system is further configured to transmit updated machining instructions to machine the part based on the change to the material of the part.

11. The control system of claim 1 wherein the design engineering database, the manufacturing database, and the production database are maintained and used separately from each other in separate physical computers that are networked with each other.

12. A method for updating a context-driven build plan for production of a physical vehicle, the method comprising:
receiving, from a user interface, an input of a requested change to a particular design digital data object associated with the physical vehicle;
assigning, based on the requested change to the particular design digital data object, a context criterion to any of:
a plurality of design digital data objects in a design engineering database, the plurality of design digital data objects associated with a particular physical vehicle;
a plurality of manufacturing digital data objects in a manufacturing database, the plurality of manufacturing digital data objects including process-related information associated with the plurality of design digital data objects; or
a plurality of production digital data objects in a production database, the plurality of production digital data objects including production information associated with the plurality of design digital data objects;
wherein assigning the context criterion to the particular design digital data object is based on properties or rules associated with the particular design digital data object;
in response to receiving the input of the requested change, using the assigned context criteria to establish a mapping between the particular design digital data object and any other of the plurality of design digital data objects, the plurality of manufacturing digital data objects, or the plurality of production digital data objects, wherein establishing the mapping is based on the properties or rules associated with the particular design digital data object to which the requested change pertains;
sending, automatically, a digital change request to an authority associated with whichever of the plurality of design digital data objects, the plurality of manufacturing digital data objects, or the plurality of production digital data objects to which the requested change for the particular digital data object pertains, wherein the digital change request includes information based on the properties or rules associated with the particular design digital data object and also on information derived from the mapping;
receiving an approval to update the context-driven build plan; and
thereafter updating the context-driven build plan with the digital change request to reflect a change to process-related information or production-related information associated with the particular design digital data object, whereby an updated build plan is generated.

13. The method of claim 12 further comprising:
generating an output of the updated build plan.

14. The method of claim 13 further comprising:
implementing, using a robotic device that receives a command based on the output, the change request during manufacturing of the physical vehicle.

15. The method of claim 12 wherein receiving the requested change associated with the particular design digital data object comprises receiving a requested change to one of a manufacturing process for a part, an inventory location for the part, or a material used for the part, and sending the digital change request includes sending the authority information derived from a rule associated with the particular design digital data object that includes one of a part storage rule, a material property rule or a multi-axis machining rule.

16. The method of claim 12 further comprising:
displaying an overall build plan at a process level; and
displaying, highlighted, how the updated build plan affects the overall build plan.

17. The method of claim 16 further comprising:
displaying a content of the overall build plan with respect to the parts as a whole, with context parts added to each stage or iteration of the overall build plan.

18. The method of claim 12 wherein the requested change is to change a manufacturing process, an inventory location or a material used for a part, and sending comprises sending a request approval to both a first authority responsible for a part and also a second authority responsible for manufacturing and storing the part, wherein sending the request for approval to the second authority is derived from the mapping and at least one rule associated with the particular design digital data object, whereby the method automatically accounts for a user being unaware that input from the second authority is needed for the change request.

19. The method of claim 18 further comprising:
transmitting updated machining instructions to a machine to machine the part based on the change to the material of the part.

20. A method for manufacturing a physical vehicle by using an updating a context-driven build plan for production of the physical vehicle, the method comprising:
receiving, from a user interface, an input of a requested change to a particular design digital data object associated with the physical vehicle;
assigning, based on the requested change to the particular design digital data object, a context criterion to any of:

a plurality of design digital data objects in a design engineering database, the plurality of design digital data objects associated with a particular physical vehicle;

a plurality of manufacturing digital data objects in a manufacturing database, the plurality of manufacturing digital data objects including process-related information associated with the plurality of design digital data objects; or a plurality of production digital data objects in a production database, the plurality of production digital data objects including production information associated with the plurality of design digital data objects;

wherein assigning the context criterion to the particular design digital data object is based on properties or rules associated with the particular design digital data object;

in response to receiving the input of the requested change, using the assigned context criterion to establish a mapping between the particular design digital data object and any other of the plurality of design digital data objects, the plurality of manufacturing digital data objects, or the plurality of production digital data objects, wherein establishing the mapping is based on the properties or rules associated with the particular design digital data object to which the requested change pertains;

sending, automatically, a digital change request to an authority associated with whichever of the plurality of design digital data objects, the plurality of manufacturing digital data objects, or the plurality of production digital data objects to which the requested change for the particular digital data object pertains, wherein the digital change request includes information based on the properties or rules associated with the particular design digital data object and also on information derived from the mapping;

receiving an approval to update the context-driven build plan;

thereafter updating the context-driven build plan with the digital change request to reflect a change to process-related information or production-related information associated with the particular design digital data object, whereby an updated build plan is generated; and modifying manufacturing of the physical vehicle based on the updated build plan.

* * * * *